United States Patent
Okada et al.

(10) Patent No.: US 6,604,232 B2
(45) Date of Patent: Aug. 5, 2003

(54) HIGH-LEVEL SYNTHESIS METHOD AND STORAGE MEDIUM STORING THE SAME

(75) Inventors: Kazuhisa Okada, Nara (JP); Koichi Nishida, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 97 days.

(21) Appl. No.: 09/741,057

(22) Filed: Dec. 21, 2000

(65) Prior Publication Data

US 2001/0016936 A1 Aug. 23, 2001

(30) Foreign Application Priority Data

Feb. 18, 2000 (JP) .................................. 2000-042083

(51) Int. Cl.⁷ .............................................. G06F 17/50
(52) U.S. Cl. ............................................. 716/18; 716/3
(58) Field of Search ................................. 716/1–21

(56) References Cited

U.S. PATENT DOCUMENTS

| | | | |
|---|---|---|---|
| 5,491,640 A | * 2/1996 | Sharma et al. ................. | 716/18 |
| 5,581,781 A | 12/1996 | Gregory et al. | |
| 5,666,296 A | 9/1997 | Gafter | |
| 5,706,205 A | * 1/1998 | Masuda et al. ................ | 364/489 |
| 6,324,680 B1 | * 11/2001 | Barnfield et al. .............. | 703/16 |
| 6,360,355 B1 | * 3/2002 | Nishida et al. ................ | 716/18 |
| 6,415,420 B1 | * 7/2002 | Cheng et al. ................... | 716/4 |
| 6,421,809 B1 | * 7/2002 | Wuytack et al. ............... | 716/2 |
| 6,438,739 B1 | * 8/2002 | Yamada ........................ | 716/18 |

FOREIGN PATENT DOCUMENTS

| | | |
|---|---|---|
| GB | 2337615 A | 11/1999 |
| JP | 11250112 | 9/1999 |

* cited by examiner

Primary Examiner—Matthew Smith
Assistant Examiner—Magid Dimyan
(74) Attorney, Agent, or Firm—Birch, Stewart, Kolasch & Birch, LLP

(57) ABSTRACT

A high-level synthesis method comprising the steps of converting an operating description describing one or more operations to a control data flow graph (CDFG) including one or more nodes representing the one or more operations and one or more I/O branches representing a flow of data, scheduling the CDFG obtained by the converting step, and allocating one or more logic circuits required for executing the CDFG obtained by the scheduling step. A portion of the CDFG in the converting step is subjected to logical synthesis in advance to generate a node, and the portion of the CDFG is replaced with that node.

8 Claims, 32 Drawing Sheets

```
if(d>e)
{
  x=a-b;
}
  else
{
  x=a*(b-c);
}
```

FIG.17

```
if (d>e)
{
   x=a-b;
}
else
{
   x=a*(b-c);
}
if (f>g)
{
   n=y-z;
}
else
{
   n=x*y*z;
}
```

FIG.21

```
if(d>e)
{
  x=a-b;
  send(x);
}
else
{
  x=a*(b-c);
  send(x);
}
```

```
if(d>e)
{
    x=(a+b-c)*c+a;
}
else
{
    x=(b+c)*c+(b+c)+a;
}
```

```
if (d>e)
{
    x=(a-b)*b+a;
}
else
{
    x=(a+b)*a-(a+b);
}
```

HIGH-LEVEL SYNTHESIS METHOD AND STORAGE MEDIUM STORING THE SAME

BACKGROUND OF THE INVENTION

1. Field of the Invention

The present invention relates to a high-level synthesis method for automatically synthesizing a digital circuit based on an operating description of an LSI, and a storage medium storing the method.

2. Description of the Related Art

Conventionally, high-level synthesis methods are known as techniques which are particularly effective in designing application-specific integrated circuits (ASIC) and the like where a short period of time is required for designing.

The high-level synthesis is a technique for automatically synthesizing a circuit based only on an operating description of a processing algorithm without information on hardware structure. The high-level synthesis technique is described in detail in "High-level Synthesis" (Kluwer Academic Publishers).

Hereinafter, for example, a method for high-level synthesizing a circuit automatically based on an operating description represented by the following expression (1), will be described:

$$x=(a+b)*(b+c) \qquad (1)$$

A typical high-level synthesis method is performed in accordance with a flowchart shown in FIG. 1. In the high-level synthesis method, control and data flow in executing an operating description are initially analyzed and converted to a model called a control data flow graph (CDFG) (see step S1 in FIG. 1). A CDFG is a graph similar to a flowchart. A CDFG is comprised of nodes and input/output (I/O) branches. The I/O branches indicate the flow of data or control signals. Nodes indicate operations. Inputs and outputs of the operations correspond to I/O branches of the nodes.

For example, an operating description shown in FIG. 1 is represented by a CDFG shown in FIG. 2. The CDFG of FIG. 2 includes first and second addition nodes 11 and 12 each representing an addition operation and a multiplication node 13 representing a multiplication operation. In the CDFG of FIG. 2, an input "a" and an input "b" are added together, an input "b" and an input "c" are added together, and the results of both addition operations are multiplied together, the result of the multiplication operation being represented by an output "x".

After the operating description represented by expression (1) has been converted to the CDFG shown in FIG. 2, scheduling is performed (see step S2 in FIG. 1). Scheduling determines the timings of executing operations corresponding to the nodes of a CDFG, i.e., to determine in which clock step each operation corresponding to a node of a CDFG is executed. In this case, operations at all of the nodes need to be completed in a clock period, taking into account the operating time of each operation.

FIG. 3 shows an example of scheduling the CDFG of FIG. 2. In FIG. 3, two addition operations and one multiplication operation are scheduled to be executed within a clock step (step 1). In this case, the scheduling is performed in such a manner that the total of the operating times of such arithmetic executions does not exceed the period of one clock step. For example, when the operating times of an adder and a multiplier are 5 nsec and 60 nsec, respectively, and the clock period is 65 nsec or more, all of the operations can be scheduled within one clock step (step 1) as shown in FIG. 3.

Identical operations which are scheduled in different clock steps can be executed in a single operator. For this reason, as shown in FIG. 5, a first addition node 11 representing a first addition and a second addition node 12 representing a second addition are scheduled to be performed in different steps 1 and 2, respectively, so that both the operations can be executed in a single adder. In this case, if the clock period is 65 nsec or more, the second addition whose operating time is 5 nsec and a multiplication whose operating time is 60 nsec can be scheduled to be performed in a second clock (clock step 2).

After an operating description has been scheduled, allocation is performed (see step 3 in FIG. 1). Allocation generates operators, registers and the like required for executing a scheduled CDFG. For example, in an allocation, operators are allocated as operations of a CDFG, and registers, selectors and the like are allocated as I/O branches across borders between adjacent clock steps. By allocation, a circuit for executing the operating description represented by expression (1) is generated (see step 4 in FIG. 1).

FIG. 4 shows the result of the scheduling in FIG. 3. In FIG. 4, first and second adders 14 and 15 corresponding to the first and second addition operations, respectively, are generated and allocated as the first and second addition nodes 11 and 12, and a multiplier 16 corresponding to the multiplication operation is generated and allocated as the multiplication node 13. In this case, no register or selector is generated since there is no branch across a border between adjacent clock steps.

FIG. 6 shows the result of the scheduling in FIG. 5. In FIG. 6, the first and second addition nodes 11 and 12 corresponding to the first and second addition operations are scheduled to be performed in different steps 1 and 2. Therefore, only one adder 14 is generated for the addition nodes 11 and 12. There are I/O branches 21 and 22 (FIG. 5) across a border between clock steps 1 and 2. Therefore, a selector 23 (indicated by "sel" in FIG. 6) and a register 24 (indicated by "reg" in FIG. 6) are generated for the I/O branches 21 and 22, respectively.

In the circuit shown in FIG. 6, inputs "a" and "c" are supplied to the selector 23, and the output of the selector 23 is input to the adder 14. Input "b" is also supplied to the adder 14. The output of the adder 14 is input to the register 24 and the multiplier 16. In this case, a controller 25 (indicated by "Controller" in FIG. 6) which produces control signals for each of the generated selector 23 and register 24 is generated. The controller 25 outputs a select signal k1 to the selector 23. The selector 23 outputs input "a" when the select signal k1 is "1", or outputs input "c" when the select signal k1 is "0". The controller 25 also outputs an enable signal k2 to the register 24. The register 24 stores an input value at the rising of a clock signal when the enable signal k2 is "1", or maintains a stored value and outputs the stored value when the enable signal k2 is "0".

The operation of the circuit shown in FIG. 6 will be described. In clock step 1, the select signal k1 and the enable signal k2 are both "1", and the selector 23 selects input "a" and outputs it to the adder 14. Then, the adder 14 outputs a value "a+b", resulting from an addition of "a" and "b", to the register 24. The register 24 stores "a+b" output from the adder 14 since the enable signal k2 is "1".

In clock step 2, the select signal k1 and the enable signal k2 are both "0", and the selector 23 selects the input value "c" and outputs it to the adder 14. Then, the adder 14 outputs a value "c+b", resulting from an addition of "c" and "b", to the multiplier 16. The stored value "a+b" is output to the multiplier 16 since the enable signal k2 is "0". The multiplier 16 multiplies the input value "c+b" by the input value "a+b", and outputs the resultant product as "x".

In the circuit shown in FIG. 4, the operating description is completed in one clock step (for example, within 100 nsec), but two adders 14 and 15 are required. In contrast, in the circuit shown in FIG. 6, two clock steps (for example, 200 nsec) are required, but only one adder 14 is used. In such a high-level synthesis method, the circuit of FIG. 4 is generated when a high-speed circuit is required, while the circuit of FIG. 6 is generated when a circuit having a small area is required.

As is understood from the scheduling result shown in FIG. 5, two addition operations can be performed using a single adder. However, when the number of operations is increased, a procedure for determining which operations are executed in a single operator is required. This procedure is allocation. Scheduling and allocation are well known in the high-level synthesis field (see the above-mentioned "High Level Synthesis" (Kluwer Academic Publishers)).

Next, a description is given of the case where an operating description includes a conditional branch. A method for high-level synthesizing an operating description including conditional branching requires generation of a control signal for controlling the conditional branching. The method is basically the same as the method shown in FIG. 1 which does not include conditional branching. The method including conditional branching is, for example, disclosed in Japanese Laid-Open Publication No. 11-250112.

Hereinafter, a method for high-level synthesizing an operating description including conditional branching will be described with reference to FIG. 7. In an operating description shown in FIG. 7, in the case of the if-condition where "d>e", x=a−b, while in the case of the else-condition, x=a*(b−c). FIG. 8 shows a CDFG corresponding to such an operating description and a result of scheduling the CDFG. As shown in FIG. 8, the CDFG includes an IF node 32 as conditional branching.

Referring to FIG. 8, a comparison node 31 representing a comparison operation is scheduled in clock step 1, and the IF node 32 is scheduled in clock step 2. The comparison node 31 receives I/O branches from inputs "d" and "e", and is also connected with a control I/O branch 33 for transmitting a control signal k. The control I/O branch 33 is indicated by a dashed line in FIG. 8.

The IF node 32 scheduled in clock step 2 includes first and second sub-CDFGs 34 and 35. The first sub-CDFG 34 can include an IF node. The first sub-CDFG 34 is executed when the control signal k is "1" (true). The second sub-CDFG 35 is executed when the control signal k is "0" (false). Thus, the comparison node 31 and the IF node 32 require a controller, so that the nodes 31 and 32 are scheduled in different clock steps.

A first subtraction node 36 receiving inputs "a" and "b" is provided in the sub-CDFG 34 indicated by "true". A second subtraction node 37 and a multiplication node 38 are provided in the sub-CDFG 35 indicated by "false". The second subtraction node 37 receives I/O branches from inputs "b" and "c". The multiplication node 38 receives I/O branches from the input "a" and the second subtraction node 37. Since the sub-CDFGs 34 and 35 are not simultaneously executed, the same single subtracter 45 (FIG. 9) can be allocated as each of the first and second subtraction nodes 36 and 37 provided in the sub-CDFGs 34 and 35, respectively.

FIG. 9 shows a circuit for executing the scheduling result of FIG. 8. In the circuit of FIG. 9, a comparator 41 is allocated as the comparison node 31, a first selector 43 is allocated for selecting inputs "a" and "b", and a second selector 44 is allocated for selecting inputs "b" and "c". Further, the single subtracter 45 is allocated as each of the first and second subtracters 36 and 37. A multiplier 46 is allocated as the multiplication node 38. A third selector 47 is allocated for selecting the outputs of the subtracter 45 and the multiplier 46. Each of the first through third selectors 43, 44, and 47 are controlled by a control signal k from a controller 42. When the value of the control signal k is "1", the first selector 43 selects the input "a", the second selector 44 selects the input "b", and the third selector 47 selects the output of the subtracter 45.

Next, such a circuit will be described. In clock step 1, the input values "d" and "e" are compared by the comparator 41, and the result of the comparison is output to the controller 42. The controller 42 generates a control signal k based on the comparison result input from the comparator 41 and outputs the control signal k in the next clock step 2. The control signal k is "1" (true) when the comparison result of the comparator 41 is "d>e", and otherwise is "0" (false). In clock step 2, when the control signal k is "1", the first and second selectors 43 and 44 select inputs "a" and "b", respectively, the subtracter 45 executes the subtraction "a−b", and the third selector 47 selects the output of the subtracter 45 and outputs the result of the subtraction "a−b" as output "x".

When the value of the control signal k is "0", the first and second selectors 43 and 44 select inputs "b" and "c", respectively, the subtracter 45 executes the subtraction "b−c", and the subtraction result is output to the multiplier 46 which in turn multiplies the subtraction result of the subtracter 45 with the input value "a" and outputs the multiplication result to the third selector 47. The third selector 47 selects the output of the multiplier 46 and outputs the result of the multiplication "a*(b−c)" as output "x".

Scheduling and allocation in a high-level synthesis method are very complicated. When an operating description includes a number of operations, the number of nodes in a corresponding CDFG is large, so that computation of the high-level synthesis requires a significantly long time.

For a high-level synthesis, a total operating time is calculated based on the operating times of operators corresponding to the respective nodes in a CDFG. For example, referring to FIG. 10, first and second "NOT" nodes 51 and 52 each having an operating time of 2 nsec and an "AND" node 53 having an operating time of 8 nsec are scheduled within a clock period of 10 nsec. As a result of scheduling, a circuit is generated as shown in FIG. 11A. In FIG. 11A, "NOT" operators 54 and 55 are allocated as the "NOT" nodes 51 and 52, respectively, and an "AND" operator 56 is allocated as the "AND" node 53.

The circuit shown in FIG. 11A can be optimized into a circuit shown in FIG. 11B in which a pair of "NOT" operators 51 and 52 and one "AND" operator 56 are logically equivalent to a single "NOR" operator 57. As a result, the total operating time is reduced to the operating time of the single "NOR" operator 57 which is 6 nsec, for example, which is thus different from the operating time (10 nsec) estimated in the high-level synthesis. That is, the estimated operating time is more than necessary. This leads to an increase in the number of clock steps in a scheduled CDFG, which slows the operation of a resulting circuit.

Moreover, in a high-level synthesis, a selector is sometimes inserted before an operator such as an adder, as shown in FIG. 6 where the selector 23 is provided before the adder 14, for example. In this case, the operating time is increased, so that the circuit is not likely to operate normally.

When an operating description including conditional branching as shown in FIG. 7 is subjected to high-level synthesis, if the number of I/O branches of the conditional branching node is large, a synthesized circuit includes a number of selectors. Thus, there is a problem that the scale of the circuit is enlarged.

Furthermore, when a control signal for conditional branching is generated by the controller 42 as shown in FIG. 9, the controller 42 typically operates in synchronization with a clock. Therefore, a condition needs to be judged in a clock step before executing one of the conditional branches. Thus, a clock step in which the control signal for the conditional branching is generated is separated from a clock step in which one of the conditional branches is executed. In this case, the circuit operation is likely to be slow.

SUMMARY OF THE INVENTION

According to one aspect of the present invention, a high-level synthesis method comprises the steps of: converting an operating description describing one or more operations to a control data flow graph (CDFG) including one or more nodes representing the one or more operations and one or more I/O branches representing a flow of data; scheduling the CDFG obtained by the converting step; and allocating one or more logic circuits required for executing the CDFG obtained by the scheduling step. A portion of the CDFG in the converting step is subjected to logical synthesis in advance to generate a node, and the portion of the CDFG is replaced with that node.

In one embodiment of this invention, the portion of the CDFG corresponds to conditional branching.

In one embodiment of this invention, the conditional branching includes a branch to be executed when a condition of the conditional branching is satisfied, and a branch to be executed when the condition of the conditional branching is not satisfied, and the branches are processed in a same clock period.

In one embodiment of this invention, a specific node originally included in the portion of the CDFG is placed outside the portion of the CDFG.

In one embodiment of this invention, a specific node originally included in the portion of the CDFG is placed outside the portion of the CDFG by dividing the portion of the CDFG.

In one embodiment of this invention, when a plurality of identical operators are allocated in the portion of the CDFG in the allocating step and when an area of one of the plurality of identical operators is as large as or larger than a constant times an area of a selector, nodes corresponding to the plurality of identical operators are placed outside the portion of the CDFG.

According to another aspect of the present invention, a storage medium stores a program including a high-level synthesis method comprising the steps of: converting an operating description describing one or more operations to a control data flow graph (CDFG) including one or more nodes representing the one or more operations and one or more I/O branches representing a flow of data; scheduling the CDFG obtained by the converting step; and allocating one or more logic circuits required for executing the CDFG obtained by the scheduling step. A portion of the CDFG in the converting step is subjected to logical synthesis in advance to generate a node, and the portion of the CDFG is replaced with that node.

Thus, the invention described herein makes possible the advantages of providing a high-level synthesis method in which an operating time required is short, the accuracy of estimation of the operating time is high, the operating speed of a high-level synthesized circuit is high, and the size of the high-level synthesized circuit is small.

These and other advantages of the present invention will become apparent to those skilled in the art upon reading and understanding the following detailed description with reference to the accompanying figures.

BRIEF DESCRIPTION OF THE DRAWINGS

FIG. 17 is a diagram showing expressions in an example of an operating description.

FIG. 21 is a diagram showing expressions in another example of an operating description.

DESCRIPTION OF THE PREFERRED EMBODIMENTS

Hereinafter, the present invention will be described by way of illustrative examples with reference to the accompanying drawings.

Example 1

Figure 12:
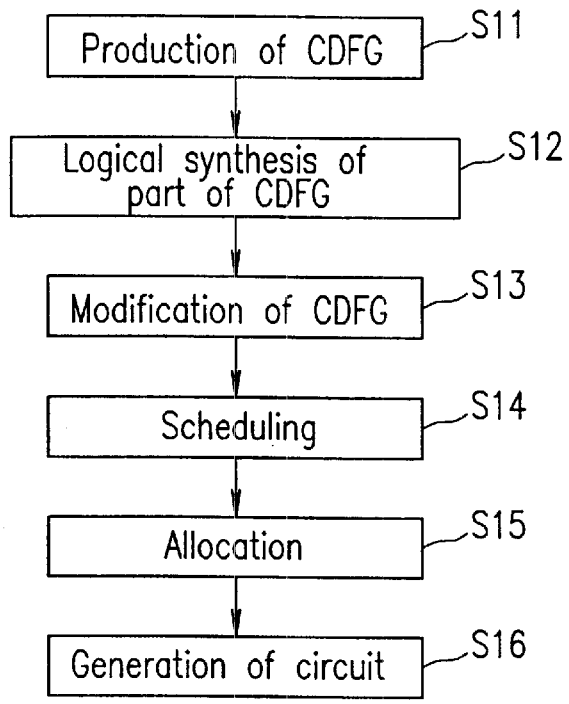
FIG. 12 is a flowchart showing a high-level synthesis method according to Example 1 of the present invention.

A high-level synthesis method according to Example 1 of the present invention is performed in accordance with a procedure shown in a flowchart of FIG. 12. Hereinafter, a method for high-level synthesizing an operating description shown in FIG. 7 will be described. In the operating description shown in FIG. 7, in the case of the if-condition where "d>e", x=a−b, while in the case of the else-condition, x=a*(b−c).

In the high-level synthesis method of Example 1, control and data flows in executing an operating description are initially analyzed and converted to a model called a control data flow graph (CDFG) (see step S11 in FIG. 12). A portion of the CDFG is subjected to logical synthesis so as to modify the CDFG (step S13). Thereafter, the modified CDFG is subjected to scheduling in a manner similar to that of conventional high-level synthesis methods (step S14), followed by allocation (step S15), thereby generating a circuit (step S16).

Figure 1:
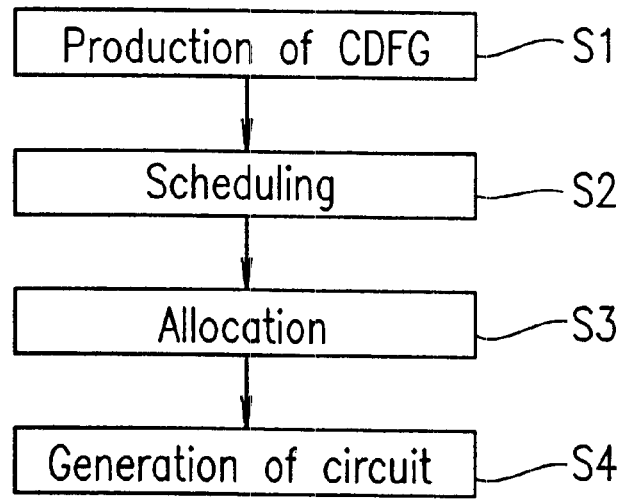
FIG. 1 is a flowchart showing a procedure of high-level synthesis.
Figure 2:
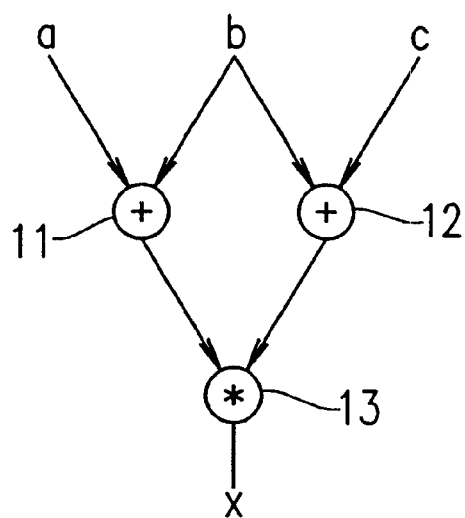
FIG. 2 is a diagram showing an example of a CDFG corresponding to an operating description represented by expression (1).
Figure 3:
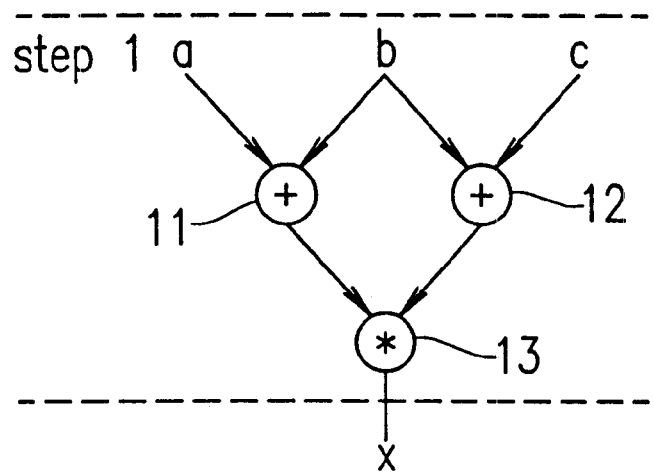
FIG. 3 is a diagram showing an example of a result from scheduling the CDFG of FIG. 2.
Figure 4:
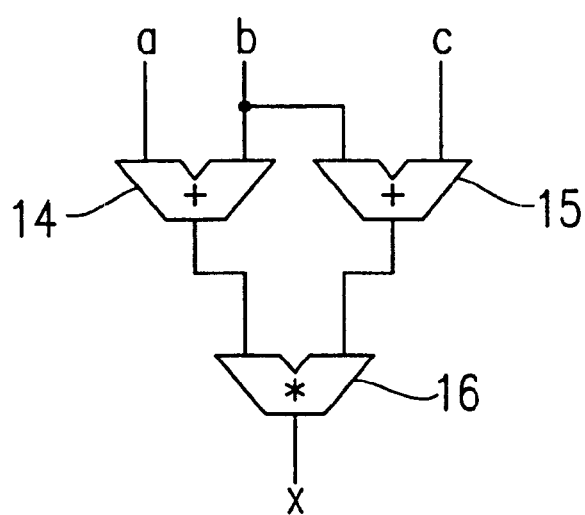
FIG. 4 is a diagram showing a circuit corresponding to the scheduling result of FIG. 3.
Figure 5:
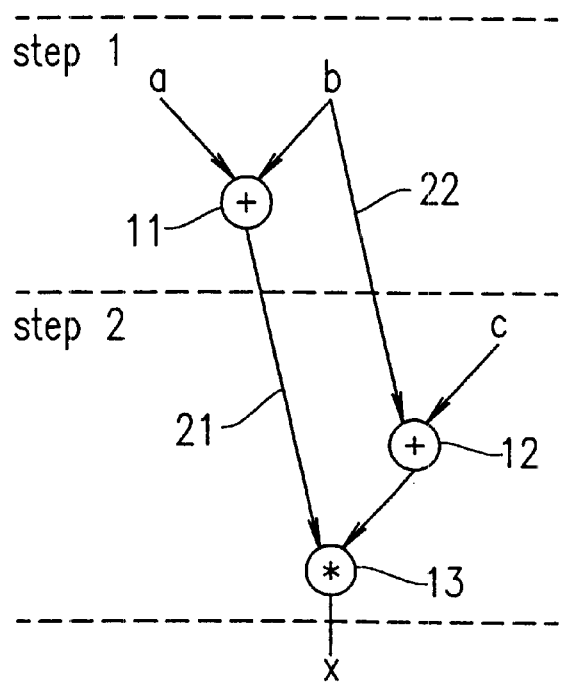
FIG. 5 is a diagram showing another example of a result from scheduling the CDFG of the operating description represented by expression (1).
Figure 6:
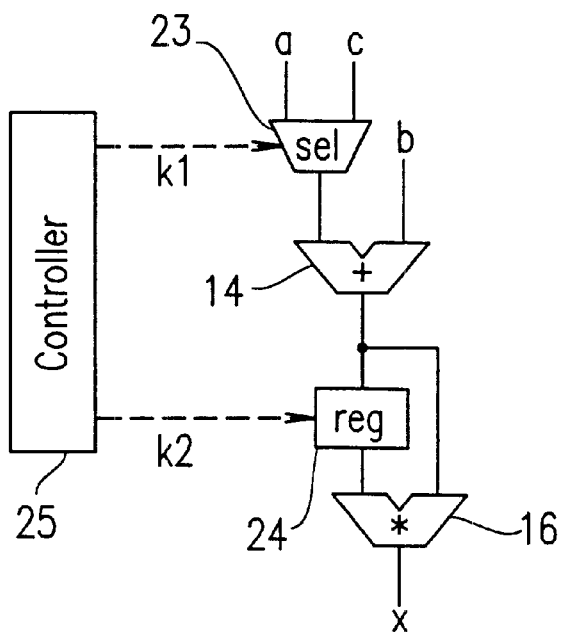
FIG. 6 is a diagram showing a circuit corresponding to the scheduling result of FIG. 5.
Figures 7, 8:
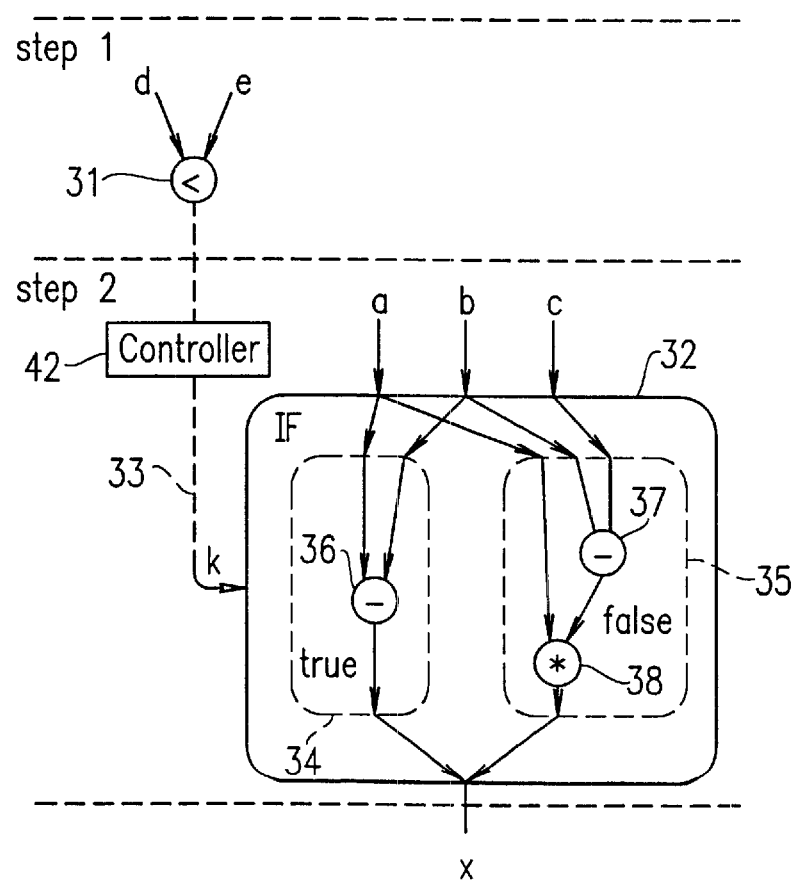
FIG. 7 is a diagram showing another example of an operating description.
FIG. 8 is a diagram showing an example of a result from scheduling the CDFG of the operating description of FIG. 7.

When the operating description of FIG. 7 is subjected to scheduling, an IF node 32 is provided as conditional branching as shown in FIG. 8. The result of the scheduling shown in FIG. 8 is the same as described in the DESCRIPTION OF THE RELATED ART section. Therefore, a description of the scheduling result is omitted.

Figure 13:
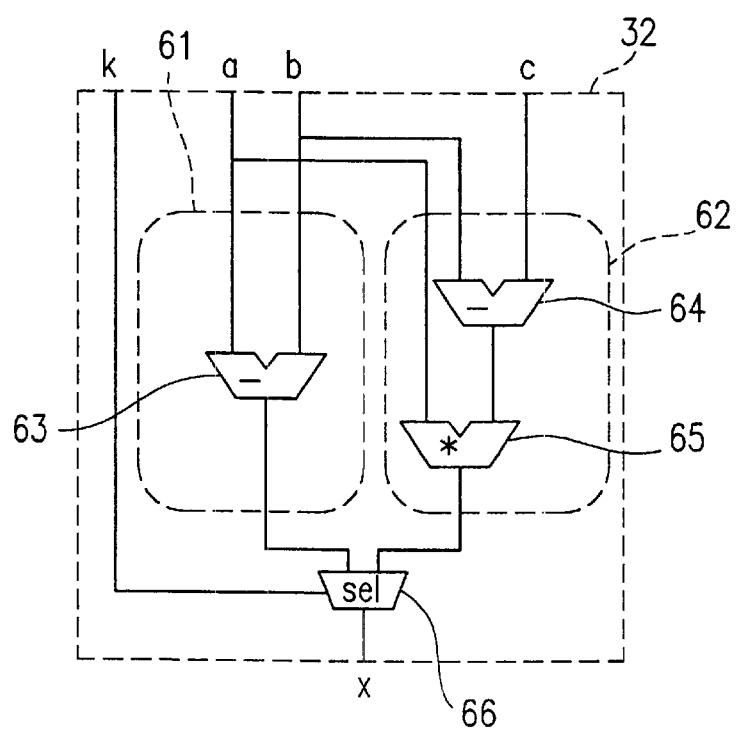
FIG. 13 is a diagram showing a combinatorial logic circuit obtained by logically synthesizing an IF node included in a CDFG in the high-level synthesis method of Example 2.

In Example 1, in the scheduling result shown in FIG. 8, the IF node 32 which is a portion of the CDFG is subjected to logical synthesis to generate a combinatorial logic circuit. FIG. 13 shows the combinatorial logic circuit thus generated.

Referring to FIG. 13, a first partial circuit 61 is a combinatorial logical circuit which realizes a sub-CDFG 34 (see FIG. 8) which is executed when the condition of the IF node 32 is "true". The first partial circuit 61 includes a first subtracter 63 which receives inputs "a" and "b".

In FIG. 13, a second partial circuit 62 is a combinatorial logical circuit which realizes a sub-CDFG 35 (see FIG. 8) which is executed when the condition of the IF node 32 is "false". The second partial circuit 62 includes a second subtracter 64 which receives inputs "b" and "c", and the multiplier 65 which receives the input "a" and the output of the second subtracter 64.

The output of the first subtracter 63 is the output of the first partial circuit 61. The output of the multiplier 65 is the output of the second partial circuit 62. The outputs of the first and second partial circuits 61 and 62 are input to a selector 66. The output of the selector 66 is the output of the entire circuit. A select signal k input to the selector 66 is the control input of the IF node 32, which is directly input to the selector 66 without passing through a controller.

Figure 14:
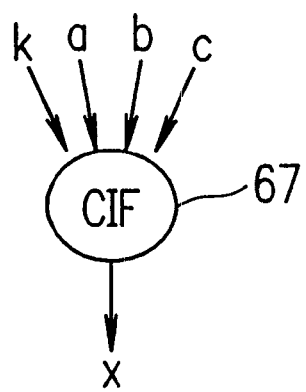
FIG. 14 is a diagram showing a node representing the combinatorial logic circuit of FIG. 13.

Next, a node is prepared, which corresponds to a combinatorial logic circuit logically synthesized from the IF node 32. The IF node 32 shown in FIG. 13 is converted to a combinational IF (CIF) node 67 (FIG. 14). The CIF node 67 receives four input branches corresponding to four inputs "k", "a", "b", and "c" of the combinational logic circuit of the IF node 32, and one output branch corresponding to output "x" thereof.

FIG. 13 shows a combinatorial logic circuit which can be handled in a CDFG in a manner similar to that for an operation such as addition and subtraction.

Figure 15:
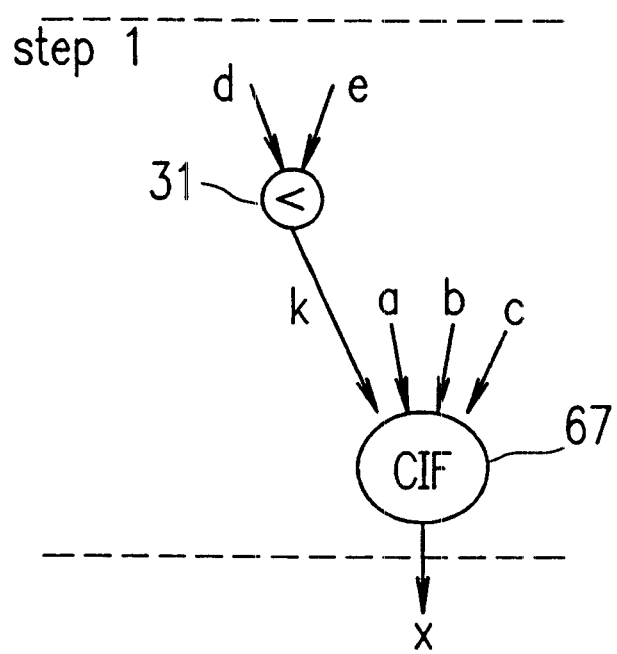
FIG. 15 is a diagram showing a CDFG using the node of FIG. 14.

When the IF node 32 in the CDFG of FIG. 8 is replaced with the CIF node 67 of FIG. 14, the CDFG of FIG. 8 is converted to a CDFG shown in FIG. 15. Whereas the CDFG of FIG. 8 includes a total of 5 nodes, i.e., the comparison node 31, the two subtraction nodes 36 and 37, the multiplication node 38, and the IF node 32, the CDFG of FIG. 15 only includes a total of two nodes, i.e., the comparison node 31 and the CIF node 67. Thus, the number of nodes included in a CDFG is decreased in Example 1, thereby making it possible to reduce the times required for scheduling, allocation, and the like in high-level synthesis.

The circuit of FIG. 15 corresponding to the CIF node 67 has already been logically synthesized. Therefore, the operating time of the circuit of FIG. 13, from when each of inputs "a", "b", "c", and "k" are input to when output "x" is eventually obtained, is a logically optimized value including the operating time of the selector 66. The operating time of the CIF node 67 of FIG. 14 is accurate. The total operating time of the nodes scheduled in a clock step is not likely to exceed a clock period, thereby preventing the circuit from functioning erroneously. The total operating time is not also likely to be too much smaller than the clock period, thereby avoiding a situation in which there is a useless operation in the circuit which hinders the circuit operation.

In the CDFG of FIG. 8, the control input branch 33 is provided for the IF node 32 and, therefore, the comparison node 31 which generates a control signal k for the IF node 32, and the IF node 32 need to be scheduled in separate clock steps. In contrast, with the CIF node 67 shown in FIG. 14, the control signal k is input to the CIF node 67 via the input branch 33 which is not involved with a controller. The CIF node 67 can be scheduled in a manner similar to that for a normal operational node such as an addition or multiplication node. For this reason, as shown in FIG. 15, the comparison node 31 which generates the control signal k and the CIF node 67 can be scheduled in the same clock step, thereby obtaining a generated circuit having high-speed operation.

Figure 16:
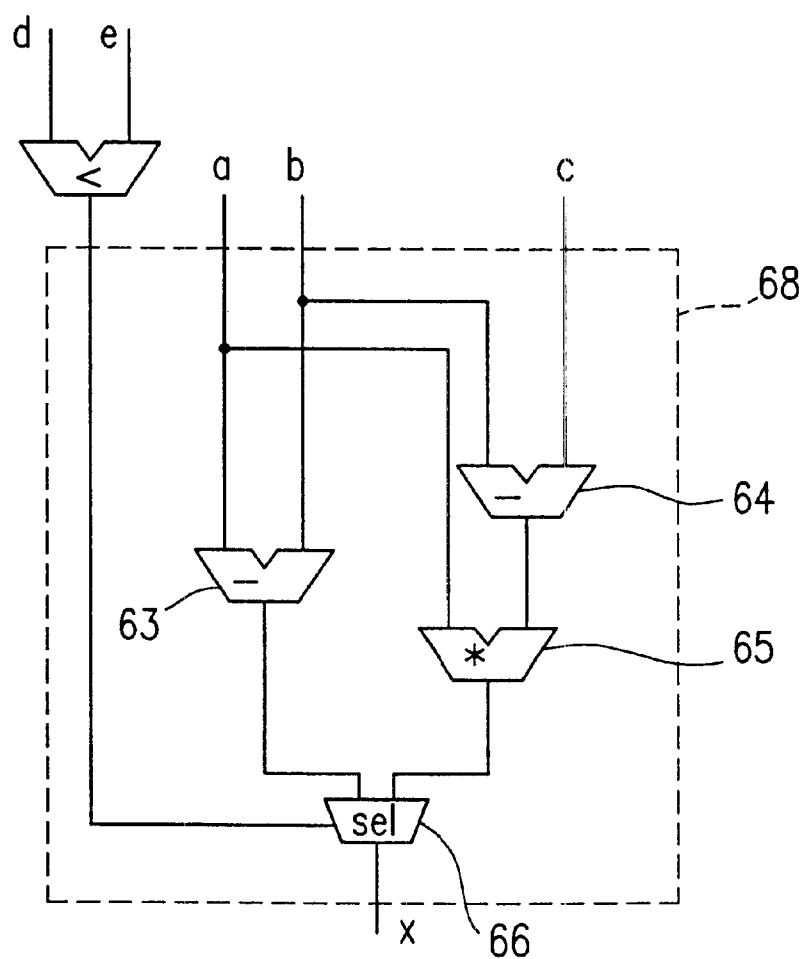
FIG. 16 is a diagram showing a circuit corresponding to the CDFG of FIG. 15.

Based on a scheduling result shown in FIG. 15, a circuit shown in FIG. 16 is obtained. In FIG. 16, a circuit 68 indicated by a dashed line is a combinatorial logic circuit corresponding to the CIF node 67 of FIG. 14 (corresponding to the IF node 32 of FIG. 13).

In the high-level synthesis method of Example 1, since a circuit corresponding to the CIF node 67 is logically synthesized in advance, the operators used in the CIF node 67 cannot be shared by other operations. Nevertheless, in the high-level synthesis method of Example 1, the combinatorial logic circuit corresponding to the CIF node 67 does not require a selector. This is preferable when the advantage of a reduction in circuit scale due to the absence of a selector is more significant than the disadvantage of an increase in circuit scale due to that an operator is not shared.

Figure 9:
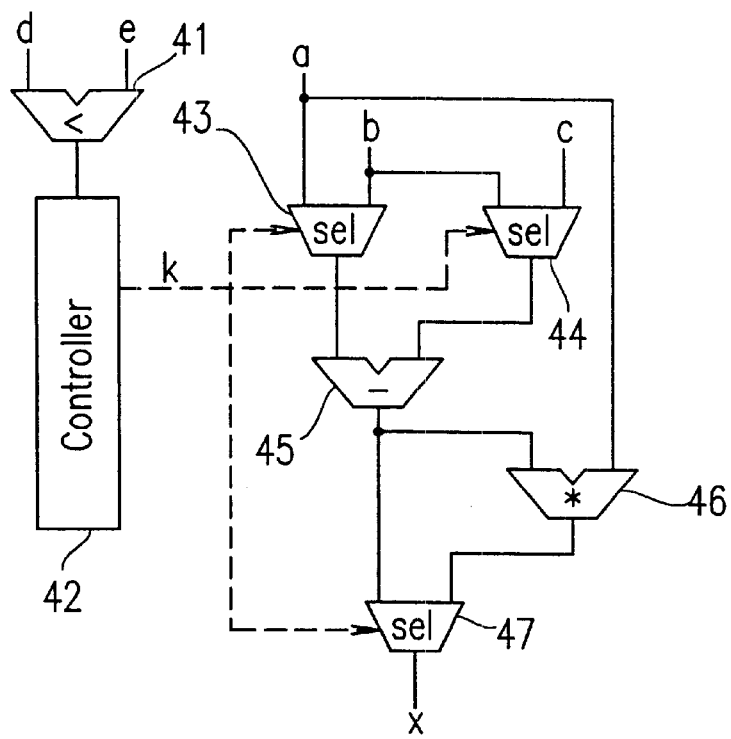
FIG. 9 is a diagram showing a circuit corresponding to the scheduling result of FIG. 8.
Figure 10:
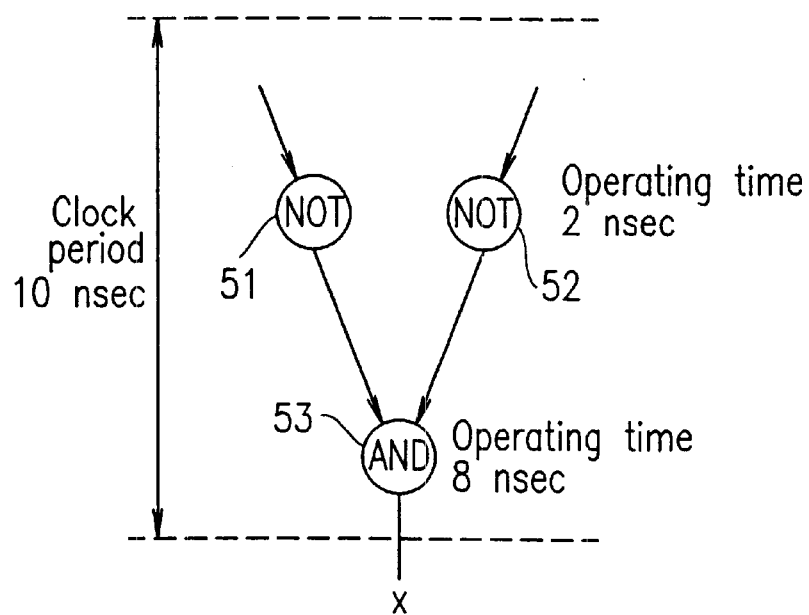
FIG. 10 is a diagram used for explaining an operating time in high-level synthesis.
Figure 11A:
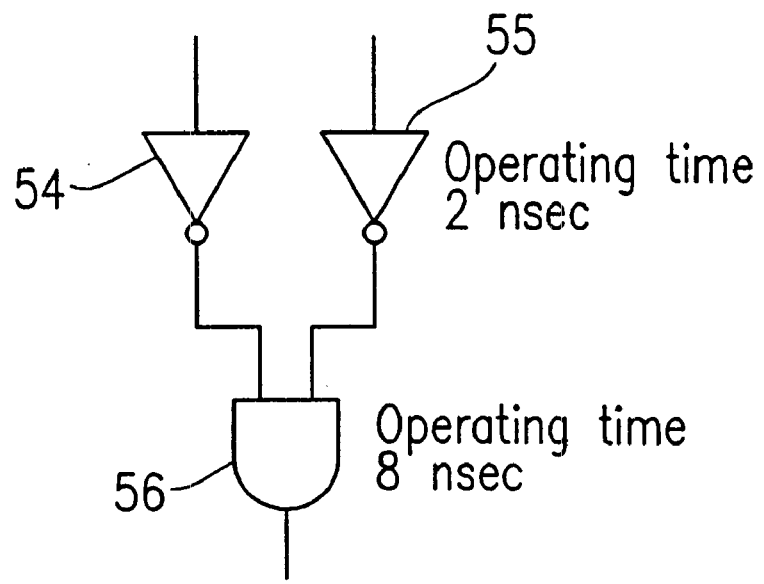
FIG. 11A is a diagram showing a circuit optimized by logical synthesis.
Figure 11B:
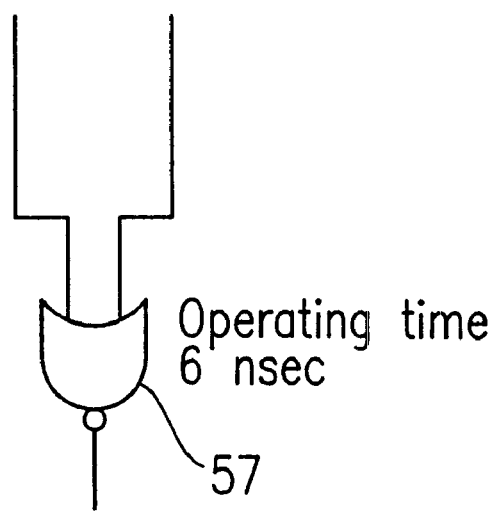
FIG. 11B is a diagram showing another circuit optimized by logical synthesis.

For example, the subtracter 45 is the only subtracter provided in the circuit of FIG. 9 obtained by the conventional high-level synthesis method. In this case, however, three selectors 43, 44, and 47 are required. In contrast, in the circuit of FIG. 16, although two subtracters 63 and 64 are required, the selector 66 is the only selector. Therefore, when the circuit scale of one subtracter is smaller than the overall circuit scale of two selectors, the circuit of FIG. 16 obtained in the high-level synthesis method of Example 1 can be downsized as compared with the circuit of FIG. 9.

Further, in the circuit of FIG. 16, the controller 42 of FIG. 9 is not required, thereby reducing the overall circuit scale.

Example 2

Another example of the present invention will be described based on an operating description shown in FIG. 17. The operating description shown in FIG. 17 is the same as that shown in FIG. 7, i.e., in the case of the if-condition where "d>e", x=a−b, while in the case of the else-condition, x=a*(b−c), except that there is an additional operating description, i.e., in the case of an if-condition where "f>g", n=y−z, while in the case of an else-condition, n=x*y*z.

Figure 17:
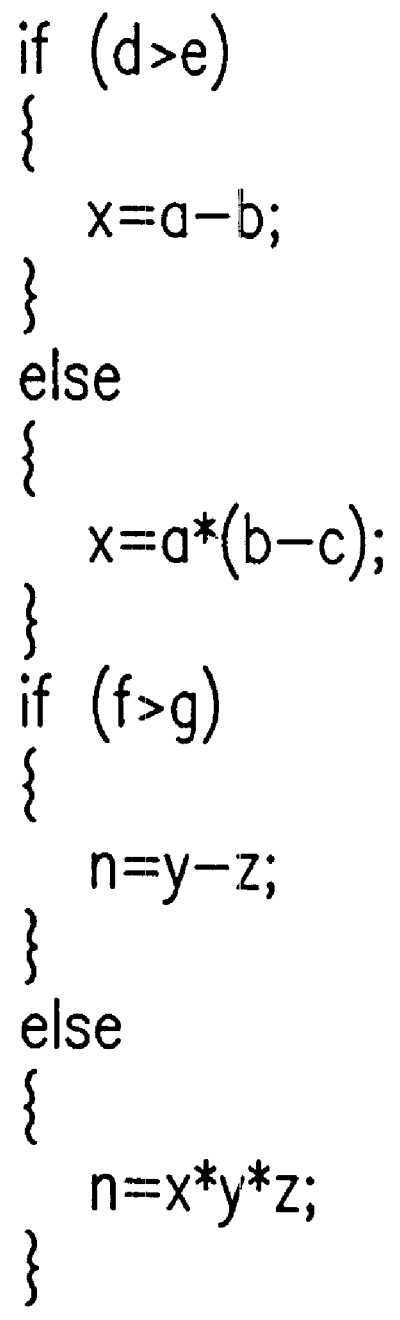
Figure 18:
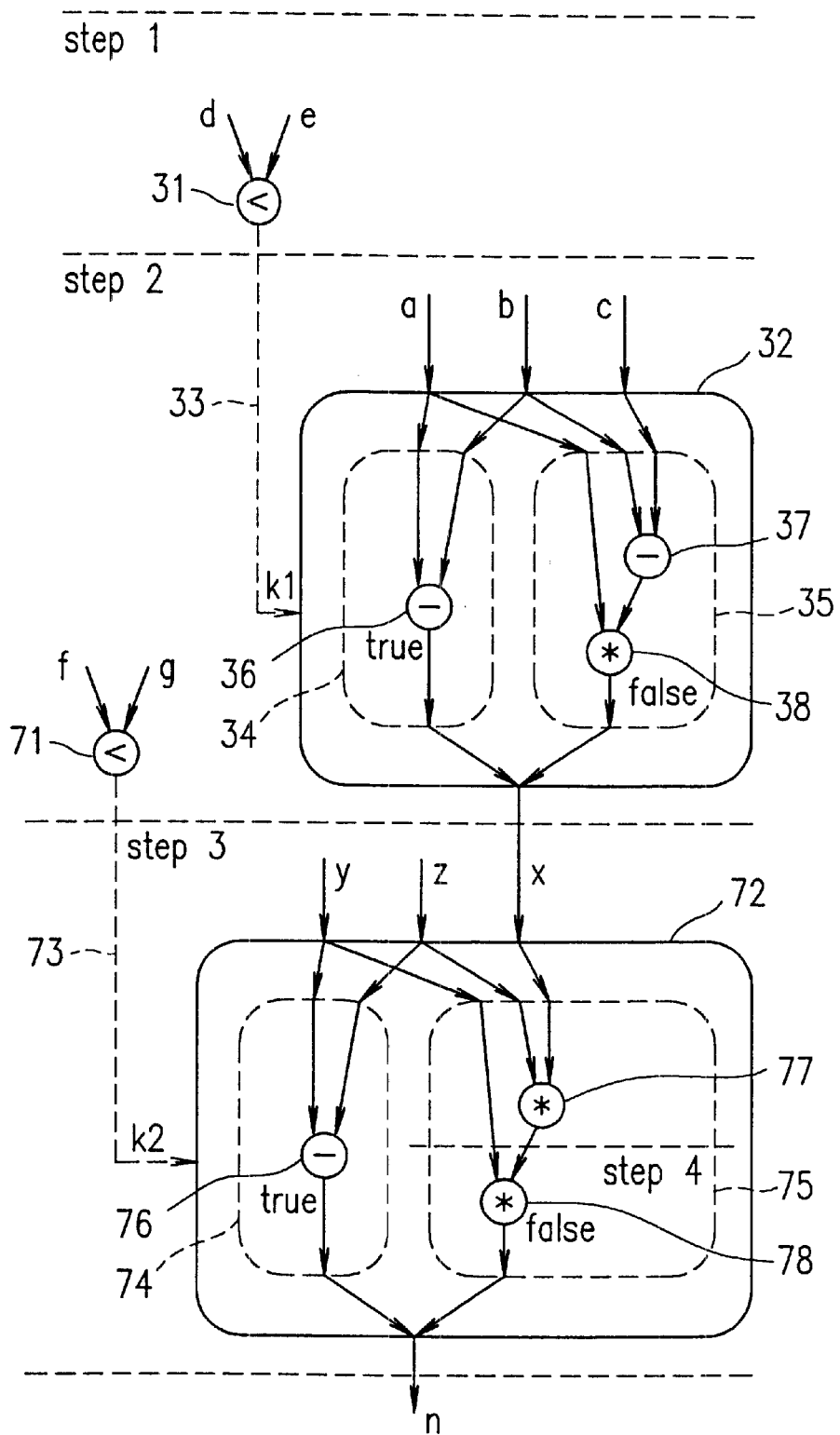
FIG. 18 is a diagram showing an example of a CDFG corresponding to the operating description of FIG. 17.

The operating description of FIG. 17 is converted to a CDFG which is in turn scheduled as shown in FIG. 18. In FIG. 17, the operating description corresponding to clock step 1 and clock step 2 is the same as that of FIG. 7 and is scheduled in the same manner as that of FIG. 8. A description of the scheduling is therefore omitted below.

In clock step 2, a comparison node 71 representing a comparison operation is also scheduled. In clock step 3, a second IF node 72 is scheduled. The comparison node 71 receives I/O input branches from inputs "f", and "g". An I/O branch from the comparison node 71 is connected to the second IF node 72 as a control I/O branch providing a control signal k2.

In the second IF node 72, first and second sub-CDFGs 74 and 75 are provided. The first sub-CDFG 74 is executed when the control signal k2 is "1" (true). The second sub-CDFG 75 is executed when the control signal k2 is "0" (false).

The sub-CDFG 74 indicated by "true" includes a subtraction node 76 which receives I/O branches from inputs "y" and "z". The sub-CDFG 75 indicated by "false" includes first and second multiplication nodes 77 and 78. The first multiplication node 77 receives I/O input branches from inputs "z" and "x". The second multiplication node 78 receives an I/O branch from the input "y" and an I/O branch from the multiplication node 77.

In such a scheduling result, it is assumed that the operating time of each allocated adder, subtracter, and comparator is 5 nsec, the operating time of a multiplier is 60 nsec, and a clock period is 100 nsec. In the first IF node 32, the operating time of the sub-CDFG 34 which is executed when the condition is "true" is 5 nsec, and the operating time of the sub-CDFG 35 which is executed when the condition is "false" is 65 nsec. Therefore, the first IF node 32 is completed in a clock step regardless of whether or not the condition is satisfied. In contrast, although in the second IF node 72 the operating time of the sub-CDFG 74 which is executed when the condition is "true" is 5 nsec which is shorter than the clock period, the operating time of the sub-CDFG 75 which is executed when the condition is "false" is 120 nsec which exceeds the clock period. Therefore, two clock steps are required. In this way, three or four clock steps are required in the entire circuit, depending on the conditions.

Figure 19:
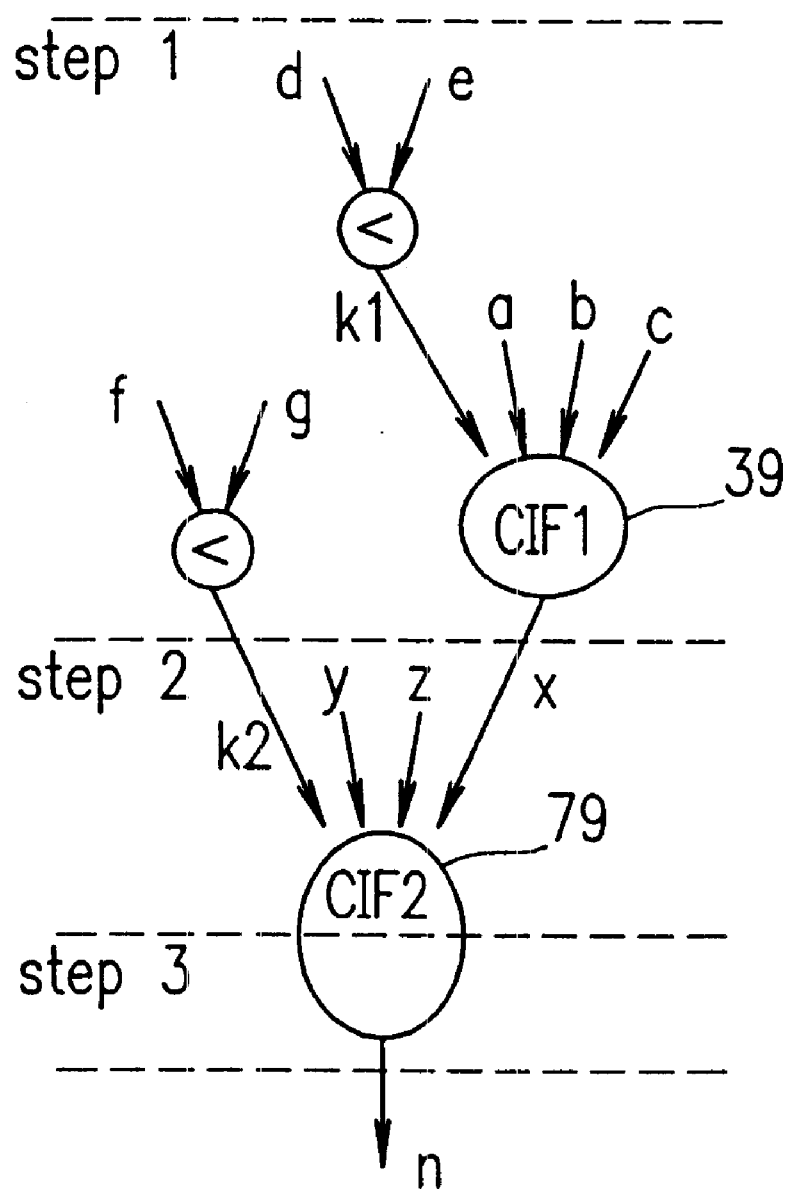
FIG. 19 is a diagram showing an example of a CDFG obtained by replacing IF nodes in the CDFG of FIG. 18 with CIF nodes.

Referring to FIG. 19, the first and second IF nodes 32 and 72 (FIG. 18) are logically synthesized to obtain first and second CIF nodes 39 and 79 ("CIF1" and "CIF2" respectively) which are combinatorial logic circuits, respectively. In this case, the operating times of the first and second CIF nodes 39 and 79 are the respective operating times of the sub-CDFG 34 or 35 and the sub-CDFG 74 or 75, which each are longer, in the first and second IF nodes 32 and 72. Thus, the operating time of the first CIF node 39 is 65 nsec, and the operating time of the second CIF node 79 is 120 nsec. Therefore, the second CIF node 79 requires two clock steps. According to the scheduling result of FIG. 19, the entire circuit requires three clock steps.

Figure 20:
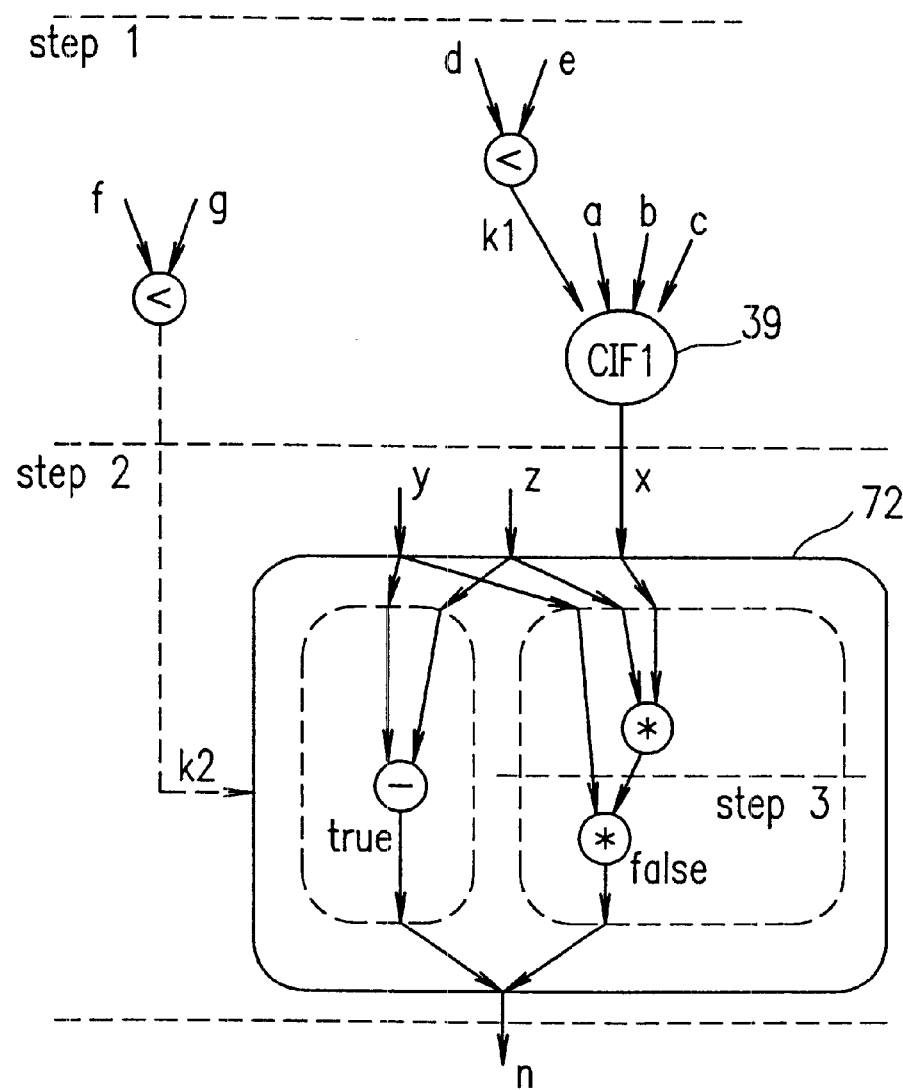
FIG. 20 is a diagram showing another example of a CDFG obtained by replacing IF nodes in the CDFG of FIG. 18 with CIF nodes.

In this case, it is assumed that only one or more nodes, which are executed in the same clock step, both in the case where the condition is satisfied ("true") and the case where the condition is not satisfied ("false"), are subjected to logical synthesis in advance. Thus, in the CDFG of FIG. 19, the first IF node 32 alone is converted to the CIF node 39, so that the CDFG of FIG. 19 becomes a CDFG shown in FIG. 20. In the second IF node 72, the number of clocks in the whole circuit is two when the condition is satisfied, and is three when the condition is not satisfied. In the case of the CDFG shown in FIG. 19, the whole circuit requires three clock steps regardless of the conditions. As compared with this, therefore, an operation speed is increased in the CDFG of FIG. 20.

Example 3

A high-level synthesis method according to Example 3 of the present invention will be described based on an operating description shown in FIG. 21. In the operating description of FIG. 21, a function "send(x)" transmits a parameter "x" through a transmission path and waits for completion of communication. Specifically, when an if-condition "d>e" is true, "x=a−b" is transmitted through the communication path, and otherwise (an else-condition) "x=a*(b−c)" is transmitted through the communication path.

Figure 21:
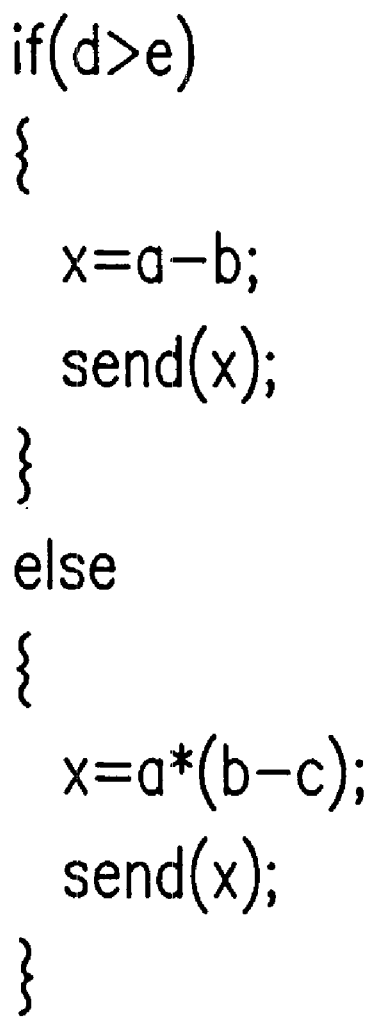
Figure 22:
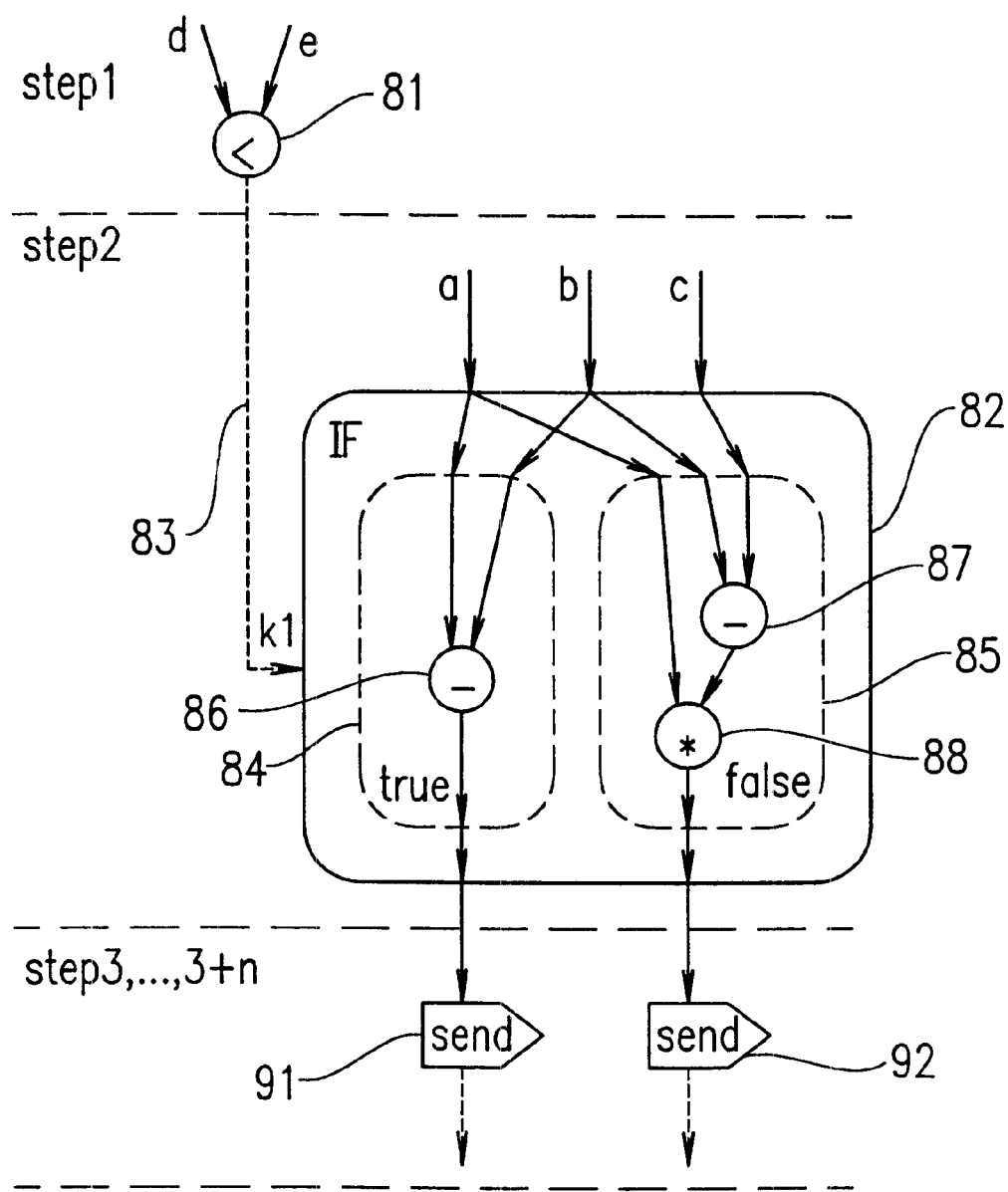
FIG. 22 is a diagram showing an example of a CDFG corresponding to the operating description of FIG. 21.

FIG. 22 shows an example of a CDFG corresponding to the operating description of FIG. 21. In FIG. 22, a comparison node 81 representing a comparison operation is scheduled in clock step 1, and an IF node 82 is scheduled in clock step 2. The comparison node 81 receives I/O branches from inputs "d" and "e". A control signal k1 is provided for the IF node 82 via an I/O branch from the comparison node 81.

In the IF node 82, first and second sub-CDFGs 84 and 85 are provided. The first sub-CDFG 84 is executed when the control signal k1 is "1" (true). The second sub-CDFG 85 is executed when the control signal k1 is "0" (false).

The sub-CDFG 84 indicated by "true" includes a subtraction node 86 which receives I/O branches from inputs "a" and "b".

The sub-CDFG 85 indicated by "false" includes a second subtraction node 87 which receives I/O branches from inputs "b" and "c" and a multiplication node 88 which receives an I/O branch from the second subtraction node 87. The multiplication node 88 also receives an I/O branch from input "a".

In clock step 3 and thereafter, first and second send nodes 91 and 92 corresponding to "send(x)" in the operating description are scheduled. The first send node 91 receives an I/O branch from the subtraction node 86, and the second send node 92 receives an I/O branch from the subtraction node 88. Each of the send nodes 91 and 92 receives one control I/O branch (not shown).

Thus, the first and second send nodes 91 and 92 which need to be controlled by a controller are placed outside the IF node 82. In this case, the IF node 82 can be realized with a combinatorial logic circuit. Therefore, as described in Examples 1 and 2, the IF node 82 can be subjected to logical synthesis in advance.

Figure 23:
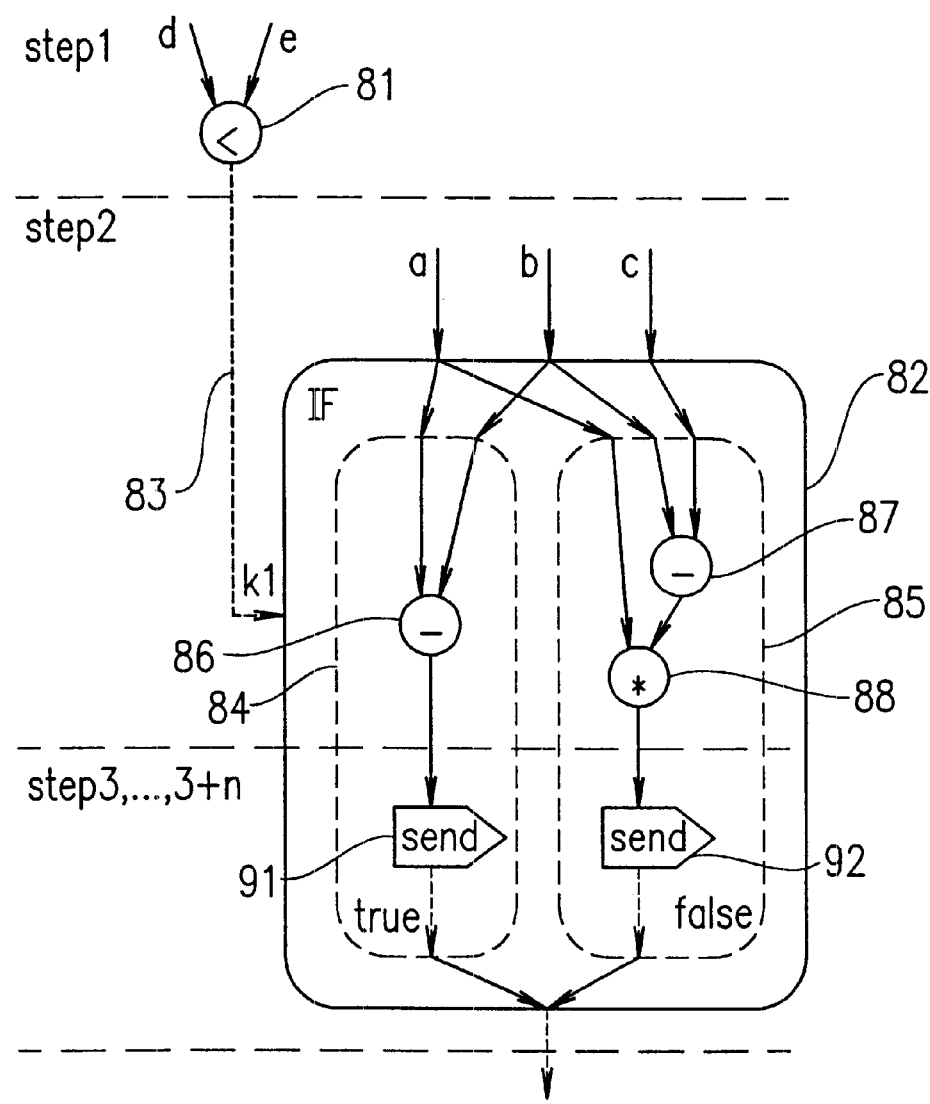
FIG. 23 is a diagram showing an example of a CDFG obtained by replacing IF nodes in the CDFG of FIG. 22 with CIF nodes.

A typical send node receives one data I/O branch and one control I/O branch. The data I/O branch transfers data to the communication path. The control I/O branch transfers a control signal which indicates completion of the data transfer. Therefore, the operating description of FIG. 21 is scheduled as shown in FIG. 23 so that the first and second send nodes 91 and 92 are provided in the first and second sub-CDFGs 84 and 85 of the IF node 82, respectively. Each of the send nodes 91 and 92 are in a waiting state until data transfer is completed. The data transfer is executed over a plurality of clock steps from clock step 3 and thereafter.

As described above, the operation of each of the send nodes 91 and 92 is controlled by the control signal from the controller, so that the CDFG 82 including the send nodes 91 and 92 needs to send and receive the control signal to and from the controller. For this reason, the CDFG 82 cannot be constructed by a combinatorial logic circuit only, and the IF node 82 including the send nodes 91 and 92 cannot be subjected to logical synthesis in advance.

As shown in FIG. 22, however, when each of the send nodes 91 and 92 is removed outside the IF node 82, the IF node 82 can be realized with a combinatorial logic circuit. In this case, the IF node 82 can be subjected to logical synthesis in advance.

Figure 24:
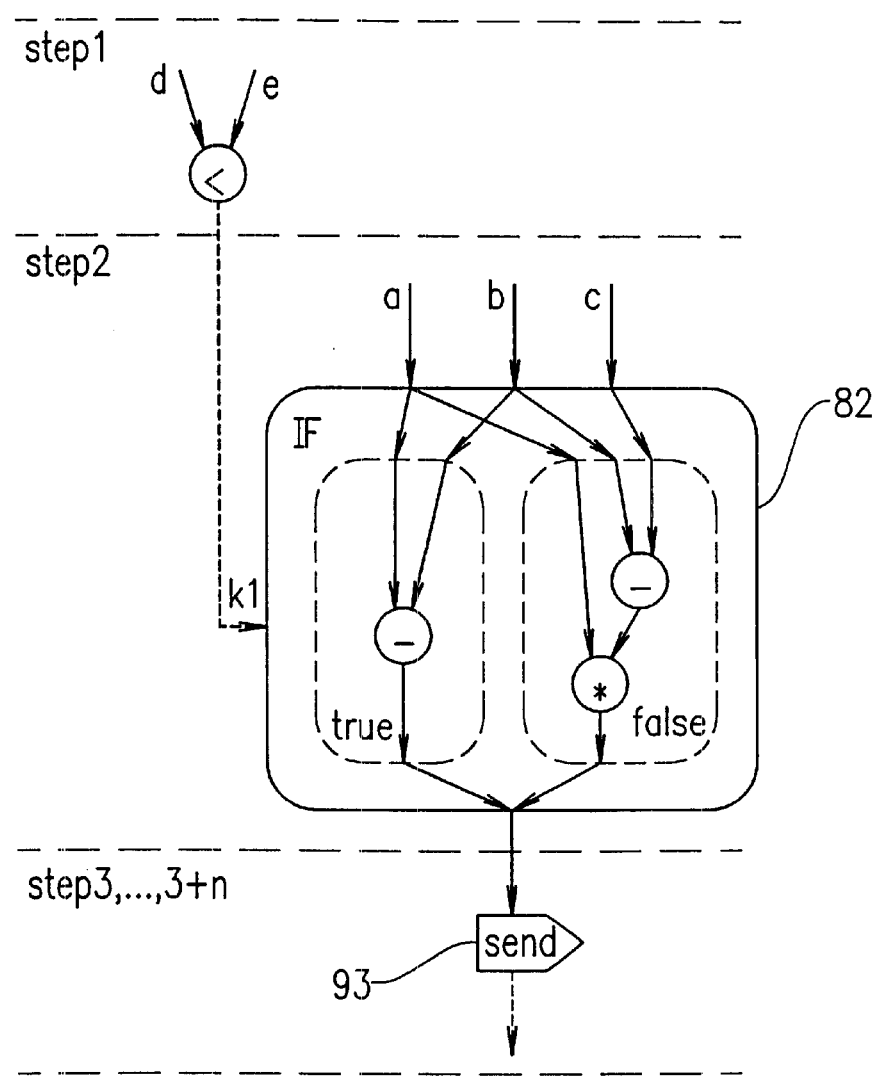
FIG. 24 is a diagram showing a CDFG obtained by optimizing the CDFG of FIG. 23.

Note that when each of the send nodes 91 and 92 is removed outside the IF node 82 as shown in FIG. 24, if the send nodes 91 and 92 have the same function, only one send node 93 may be employed.

Figures 25, 26:
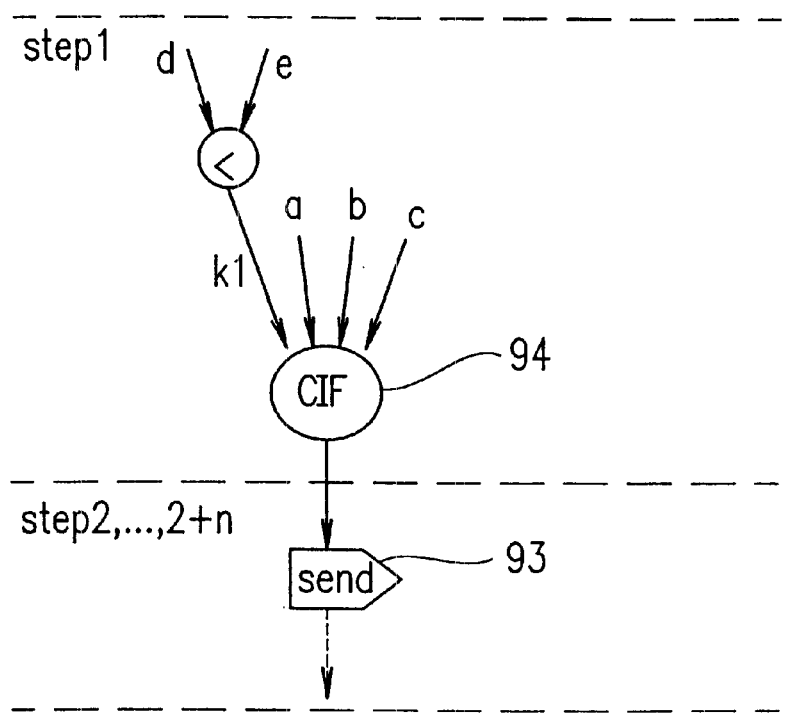
FIG. 25 is a diagram showing an example of a CDFG obtained by replacing IF nodes in the CDFG of FIG. 24 with CIF nodes.
FIG. 26 is a diagram showing another example of an operating description.

FIG. 25 shows a scheduling result where an IF node 82 of FIG. 24 is subjected to logical synthesis to generate a combinatorial logic circuit as shown in FIG. 13 and is replaced with a corresponding CIF node 94 in a manner similar to that of FIG. 15. The scheduling result of FIG. 25 has the number of clocks one smaller than that of the scheduling result of FIG. 23, thereby increasing the operation speed.

When a node which cannot be realized by a combinatorial logic circuit exists at a top level of a sub-CDFG of an IF node, the node may be removed to an upper side of the IF node.

Example 4

A high-level synthesis method according to Example 4 of the present invention will be described based on an operational description shown in FIG. 26. In FIG. 26, when an if-condition "d>e" is true, x=(a+b−c)*c+a, and otherwise (an else-condition) x=(b+c)*c+(b+c)+a.

Figure 27:
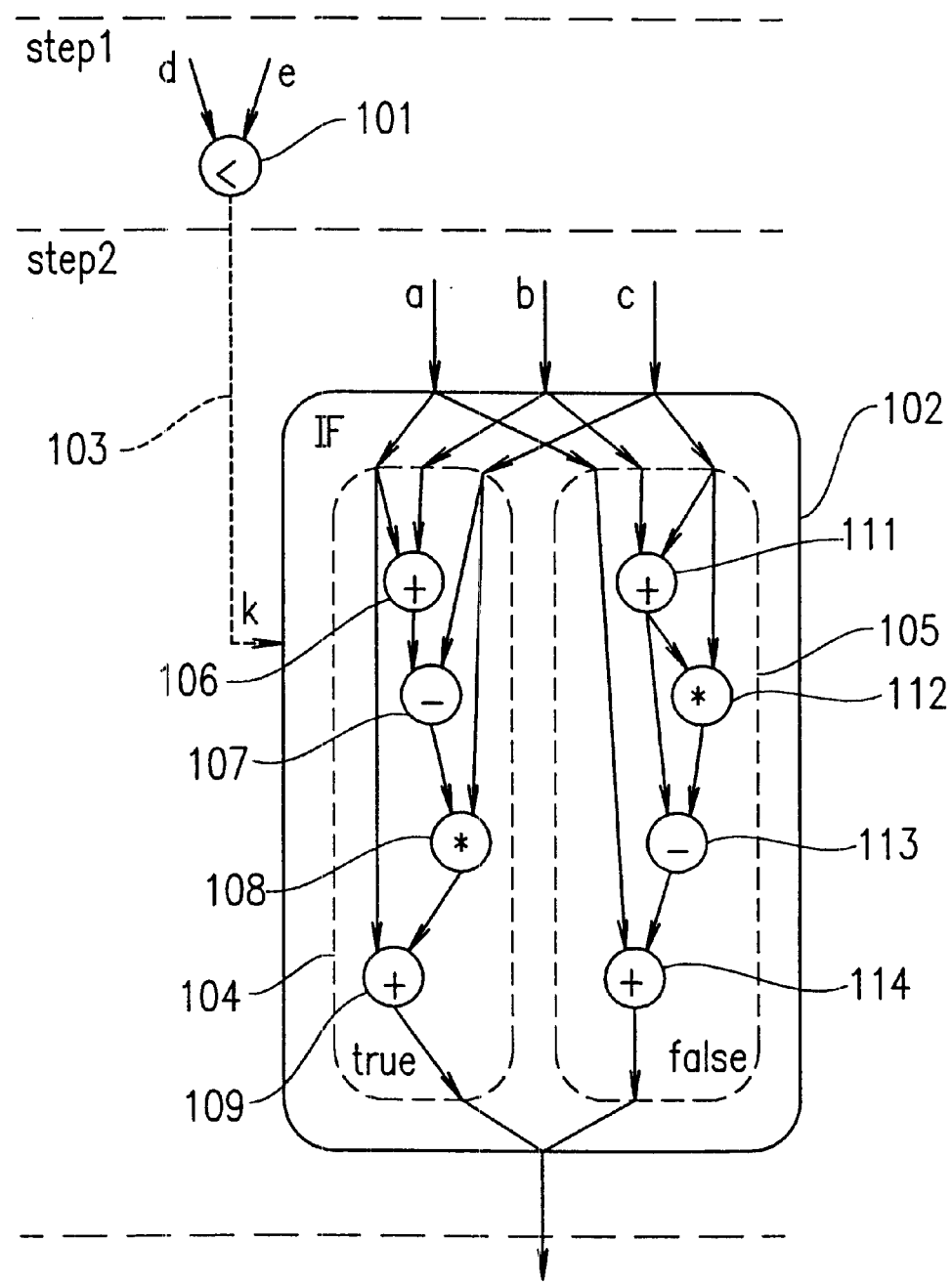
FIG. 27 is a diagram showing an example of a CDFG corresponding to the operating description of FIG. 26.

FIG. 27 shows an example where the operating description is converted to a CDFG and the CDFG is subjected to scheduling. As shown in FIG. 27, a comparison node 101 representing a comparison operation is scheduled in clock step 1, and an IF node 102 is scheduled in clock step 2. The comparison node 101 receives I/O branches from inputs "d" and "e" and a control I/O branch 103 transferring a control signal k to the comparison node 101.

The IF node 102 includes first and second sub-CDFGs 104 and 105. The first sub-CDFG 104 can include an IF node. The first sub-CDFG 104 is executed when the control signal k is "1" (true). The second sub-CDFG 105 is executed when the control signal k is "0" (false).

The sub-CDFG 104 indicated by "true" includes a first addition node 106 which receives I/O branches from inputs "a" and "b". The I/O branch of the first addition node 106 is connected to a first subtraction node 107. The subtraction node 107 receives an I/O branch from input "c". The I/O branch of the first subtraction node 107 is connected to a first multiplication node 108. The first multiplication node 108 receives an I/O branch from input "c". The I/O branch of the first multiplication node 108 is connected to a second addition node 109. The second addition node 109 receives an I/O branch from input "a". The I/O branch of the second addition node 109 is coupled to an I/O branch of the IF node 102.

The sub-CDFG 105 indicated by "false" includes a third addition node 111 which receives I/O branches from inputs "b" and "c". An I/O branch from the third addition node 111 is connected to a second multiplication node 112 and a second subtraction node 113. The second multiplication node 112 receives an I/O branch from input "c". An I/O branch from the second multiplication node 112 is connected to the second subtraction node 113. An I/O branch from the second subtraction node 113 is connected to a fourth addition node 114. The fourth addition node 114 receives an I/O branch from input "a". An I/O branch from the fourth addition node 114 is coupled to the I/O branch of the IF node 102.

Figure 28:
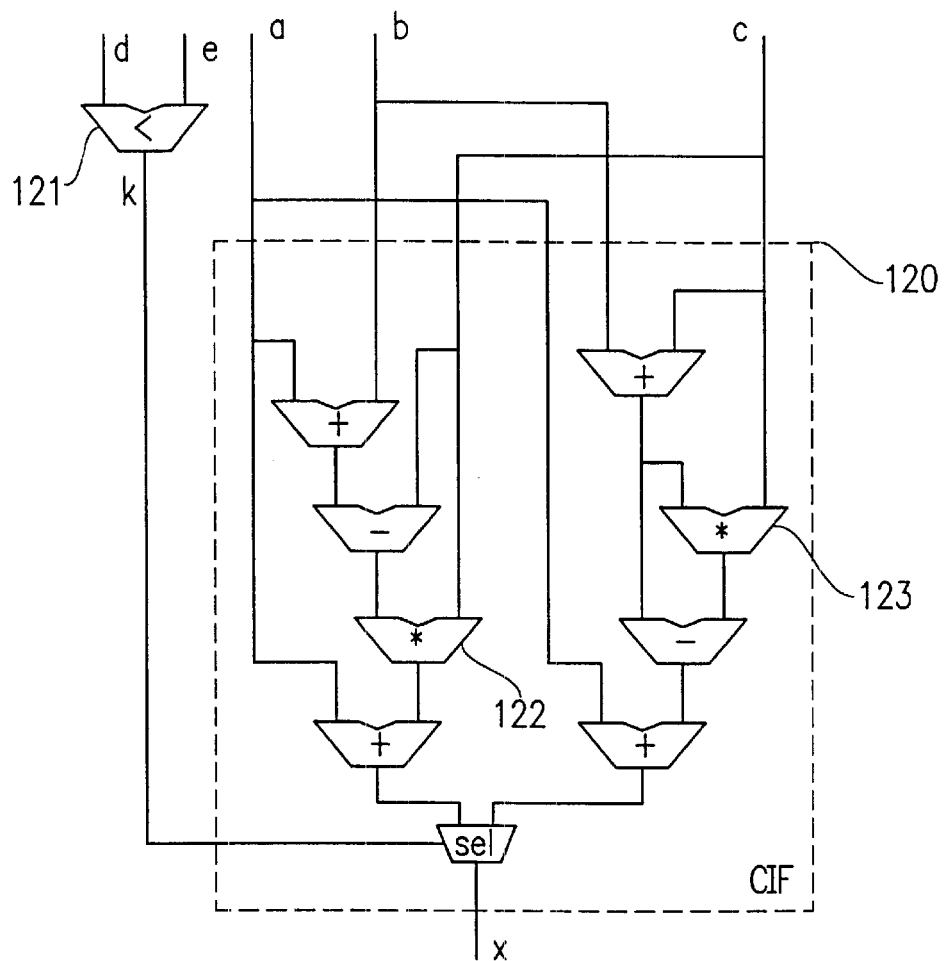
FIG. 28 is a diagram showing a circuit corresponding to the CDFG of FIG. 27.

In the CDFG of FIG. 27, only IF nodes, which are executed in the same clock step, both in the case where the condition is satisfied ("true") and the case where the condition is not satisfied ("false"), are subjected to logical synthesis in advance, as in Examples 1 and 2. In this way, a circuit shown in FIG. 28 is obtained. In such a circuit, a comparator 121 is allocated as the comparison node 101, and a CIF node 120 is allocated as a combinatorial logic circuit corresponding to the IF node 102.

When the multiplication nodes 108 and 112 are included both in the sub-CDFG 104 which is executed when the condition of an IF node is satisfied and in the sub-CDFG 105 which is executed when the condition of an IF node is not satisfied, the CDFG of FIG. 27 is subjected to logical synthesis to generate a combinatorial logic circuit shown in FIG. 28 which includes two multipliers 122 and 123. A typical multiplier has a large area compared with that of an adder and a subtracter, thereby increasing the area of the generated whole circuit.

To prevent the increase of the circuit scale, the following technique is performed. An IF node is divided at an upper side and a lower side of a specified node so that the specified node is placed outside the IF node. Thereby, the area of the whole circuit is prevented from being increased when the IF node is subjected to logical synthesis in advance. Further, when a node, which needs to be controlled by a controller and therefore cannot be converted to a combinatorial logic circuit, is a specified node which is placed outside an IF node, the IF node including the specified node can be subjected to logical synthesis to generate a combinatorial logic circuit.

Such a technique will be described with reference to a flowchart shown in FIG. 29. An operating description is initially converted to a CDFG using a typical technique (step S21 in FIG. 29). Nodes included in the resultant CDFG are divided at an upper side and a lower side of a specified node into groups (step S22).

Figure 30:
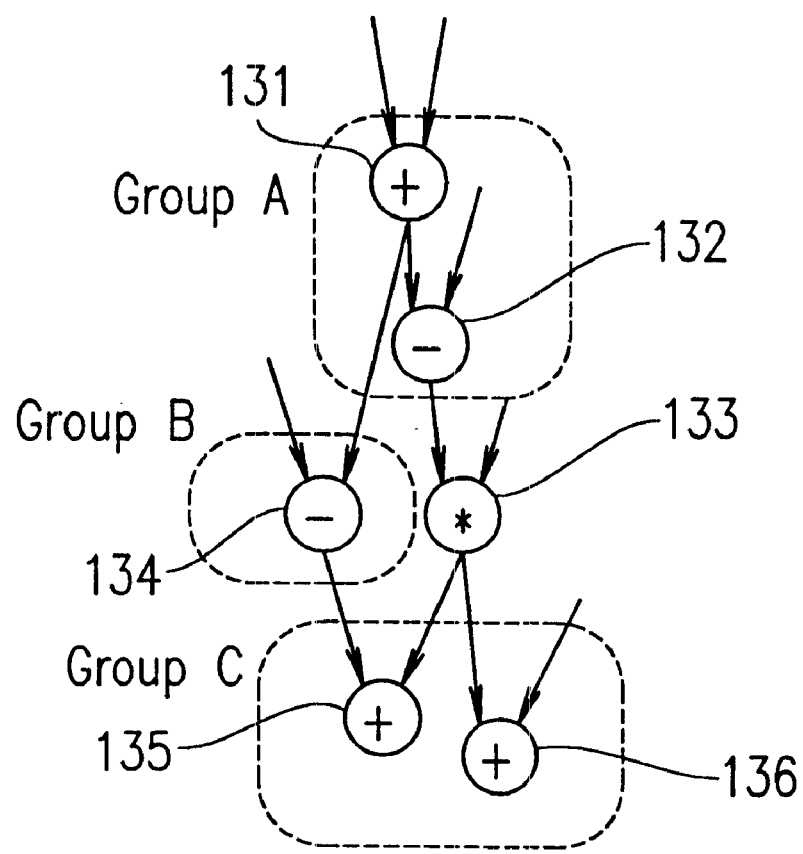
FIG. 30 is a diagram used for explaining the case where nodes are grouped.

A technique for grouping nodes will be described with reference to a CDFG shown in FIG. 30. In the CDFG of FIG. 30, an I/O branch from a first addition node 131 which receives two I/O branches is connected to a first subtraction node 132. The first subtraction node 132 receives an I/O branch which is connected to a multiplication node 133. A first I/O branch from the multiplication node 133 is connected to a second addition node 135 and a second I/O branch from the multiplication node 133 is connected to a third addition node 136. Another I/O branch from the first addition node 131 is connected to a second subtraction node 134, and an I/O branch from the second subtraction node 134 is connected to the second addition node 135.

In such a CDFG, when the multiplication node 133 whose area is large is placed outside the IF node, the circuit scale can be prevented from being increased. In this case, the nodes included in the CDFG are grouped as shown in FIG. 30. In the grouping of the nodes, the multiplication node 133 which is to be placed outside the IF node is a specified node, and nodes at the upper and lower sides of the specified multiplication node 133 are grouped. Group A positioned at the upper side of the multiplication node 133 includes nodes having outputs directly or indirectly input to the multiplication node 133. The first addition node 131 and the first subtraction node 132 are included in Group A. An output of the first addition node 131 is input via the first subtraction node 132 to the multiplication node 133.

Group C positioned at the lower side of the multiplication node 133 includes nodes which receive outputs of the multiplication node 133. The third addition node 135 and the fourth addition node 136 are included in Group C. In this case, a node to which an output of the multiplication node 133 is input via another node can also be included in Group C. Group B includes nodes which are not included in Group A nor C and which are not involved with the operation of the multiplication node 133. The second subtraction node 134 is included in Group B. Thus, nodes of the IF node are grouped.

Figure 29:
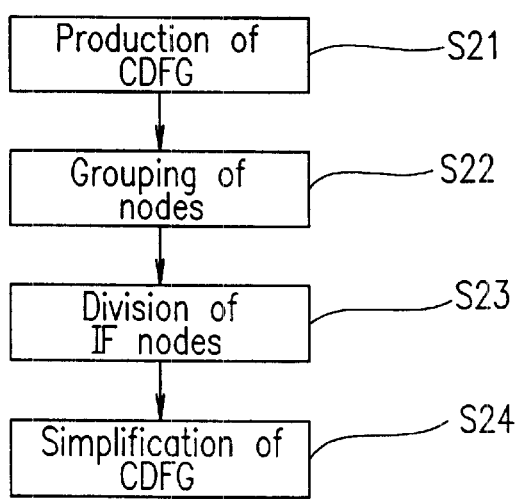
FIG. 29 is a flowchart showing a high-level synthesis method according to Example 4 of the present invention.

After the nodes have been grouped in this way, the IF node is divided into the resultant groups and specified nodes are placed outside the IF node (step S23 in FIG. 29). Thereafter, the nodes which are placed outside the IF node are replaced with a common node, and unnecessary I/O branches are deleted, thereby simplifying the CDFG (step S24). Thereafter, in a manner similar to that of the above-described high-level synthesis method, the modified CDFG is subjected to scheduling and allocation, thereby generating a circuit.

Such a high-level synthesis method will be described based on the CDFG of FIG. 27. As described above, the nodes included in the IF node 102 are grouped. In this case, grouping of nodes is performed with respect to the sub-CDFG 104 indicated by "true" and the sub-CDFG 105 indicated by "false" in the IF node 102, placing the first and second multiplication nodes 108 and 112 having large circuit scale outside the IF node 102.

Thus, Group A positioned at the upper side of the first multiplication node 108 includes the first addition node 106 and the first subtraction node 107 whose outputs are input to the first multiplication node 108. Group C positioned at the lower side of the first multiplication node 108 includes the second addition node 109 which receives an output from the first multiplication node 108.

Similarly, Group A positioned at the upper side of the second multiplication node 112 includes the third addition node 111 whose output is input to the second multiplication node 112. Group C positioned at the lower side of the second multiplication node 112 includes the second subtraction node 113 and the fourth subtraction node 114 which receive outputs from the second multiplication node 112.

As described above, the nodes included in the IF node 102 are divided into two groups, one of which is a first IF node 141 (indicated by "IF1" in FIG. 31) including the nodes included in Group A and the other of which is a second IF node 142 (indicated by "IF2" in FIG. 31) including the nodes included in Group C.

In this case, it is assumed that there is a Group B which includes a node(s) which is not involved with the first and second multiplication nodes 108 and 112. When the number of nodes included in Group A is smaller than the number of nodes included in Group C, the node(s) of Group B is included in a first IF node 141 including Group A. Otherwise, the node(s) of Group B is included in a second IF node 142 including Group C. The first and second multiplication nodes 108 and 112 are included in neither Group A, B, nor C, and therefore are placed between the first and second IF nodes 141 and 142, i.e., outside the first and second IF nodes 141 and 142 as shown in FIG. 31.

Figure 31:
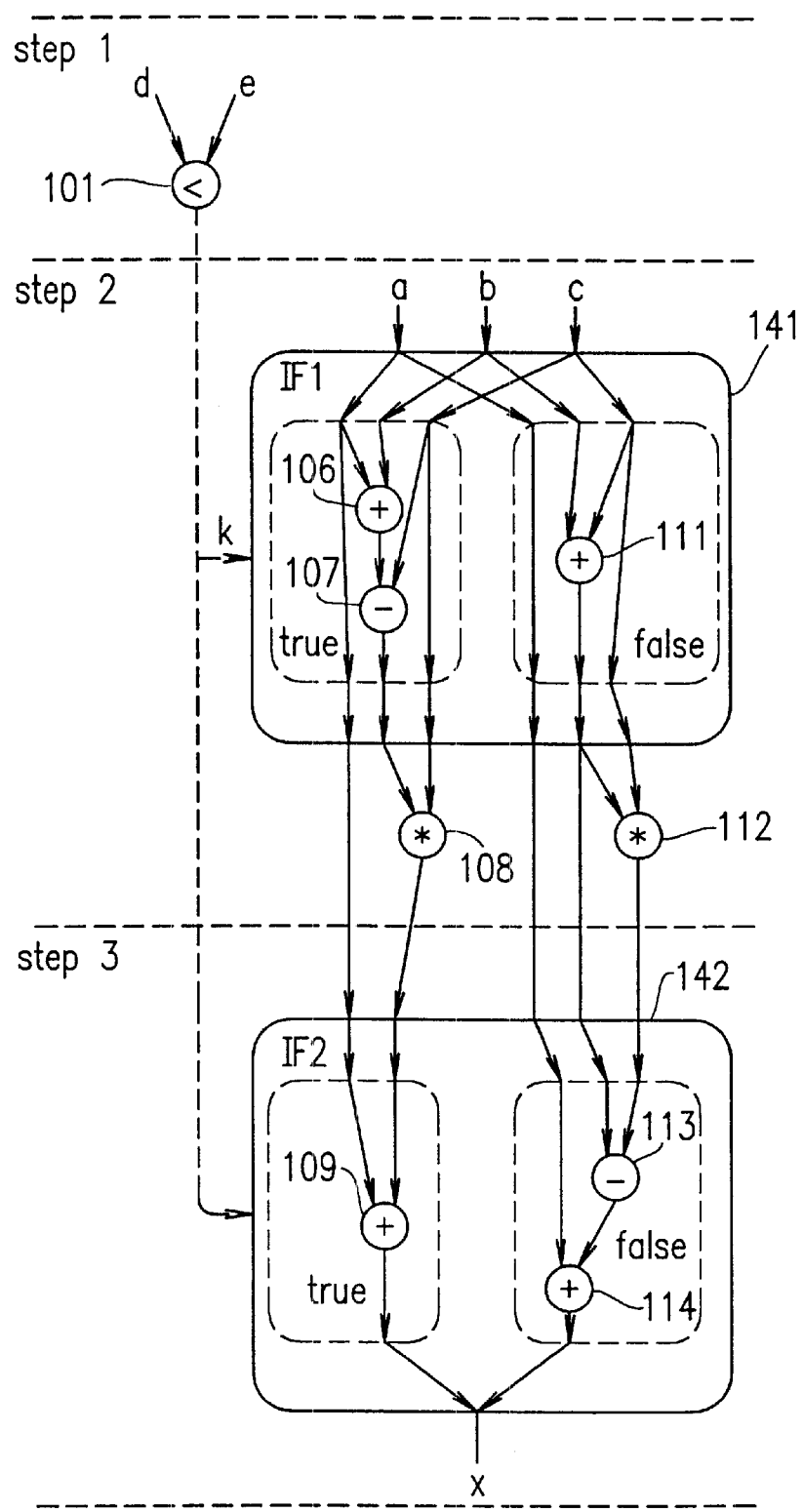
FIG. 31 is a diagram showing a CDFG where the CDFG of FIG. 26 is divided.

As shown in FIG. 31, a simplified CDFG is obtained. The simplification of the CDFG is performed as described above. Specifically, when a plurality of nodes placed outside an IF node are the same, these nodes are replaced with a single common node, and unnecessary I/O branches are deleted.

Figure 32:
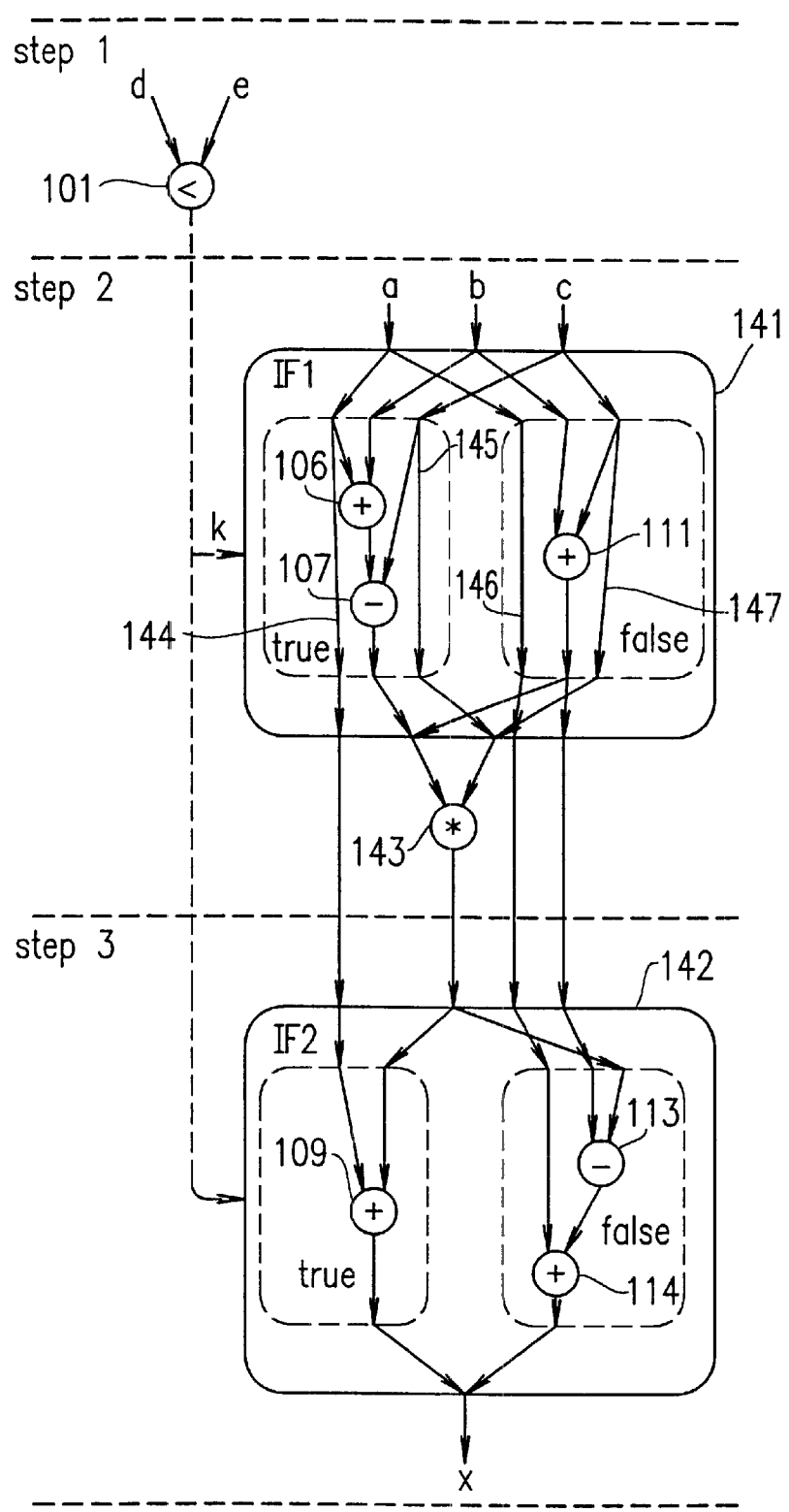
FIG. 32 is a diagram showing a CDFG where the CDFG of FIG. 31 is optimized.

Based on the resultant CDFG of FIG. 31, the first and second multiplication nodes 108 and 112 placed outside the first and second IF nodes 141 and 142 are replaced with a single multiplication node 143 as shown in FIG. 32. Therefore, a single multiplication is allocated as the two multiplication nodes 108 and 112. In this case, the two nodes which are replaced with a common node need to be executed by the same operator. When the two nodes are different from each other in operation, the two nodes are not replaced with a common node.

Figure 33:
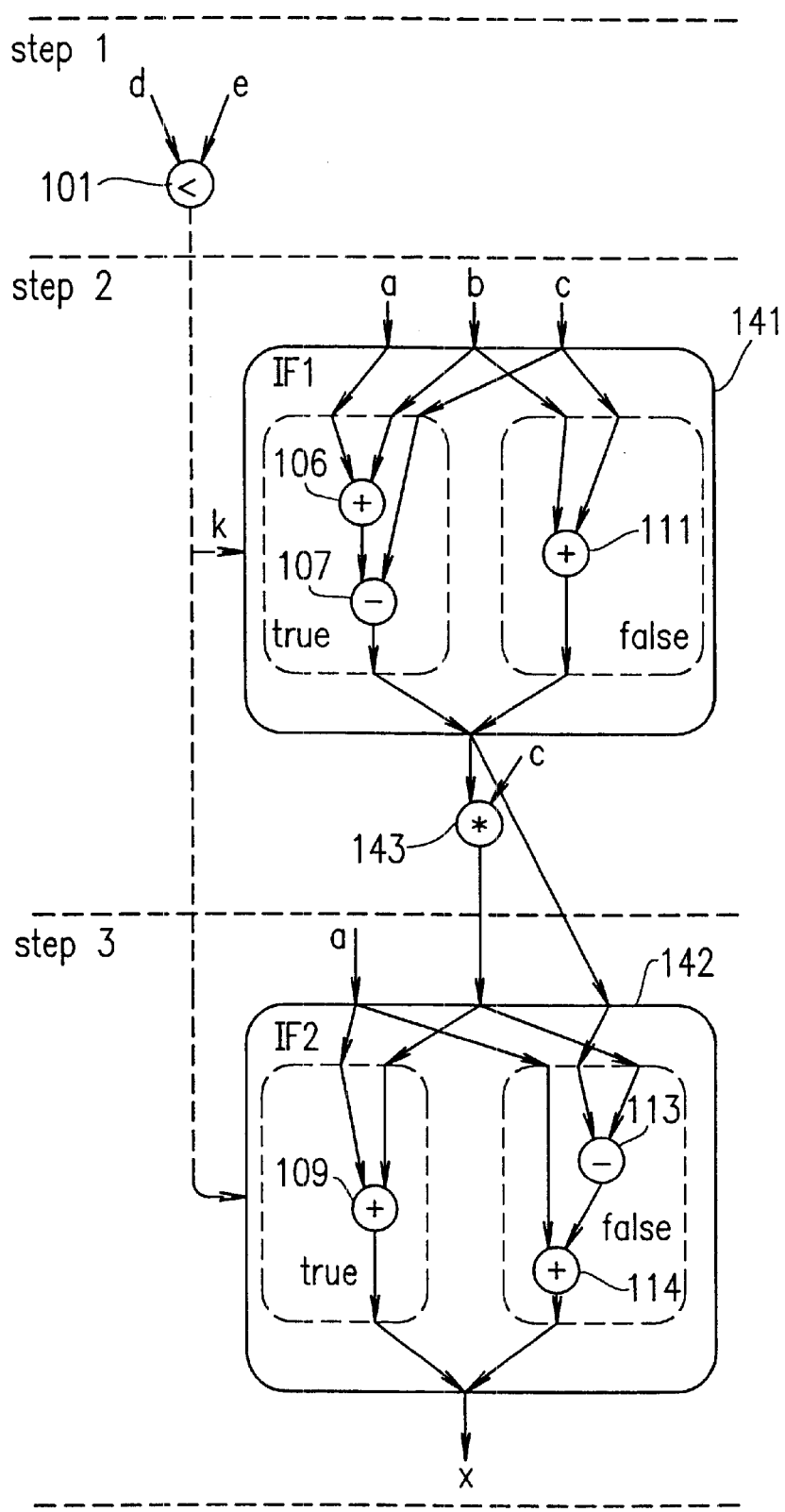
FIG. 33 is a diagram showing a CDFG where the CDFG of FIG. 32 is simplified.

Thereafter, unnecessary I/O branches are deleted. The unnecessary I/O branches are ones which are not connected to a node in the IF nodes 141 and 142 and pass through the IF nodes 141 and 142 without being involved with any operation therein. Referring to FIG. 32, I/O branches 144 through 147 in the first IF circuit 141 are unnecessary I/O branches. By deleting the I/O branches 144 through 147, a simplified CDFG is obtained as shown in FIG. 33.

Figure 34A:
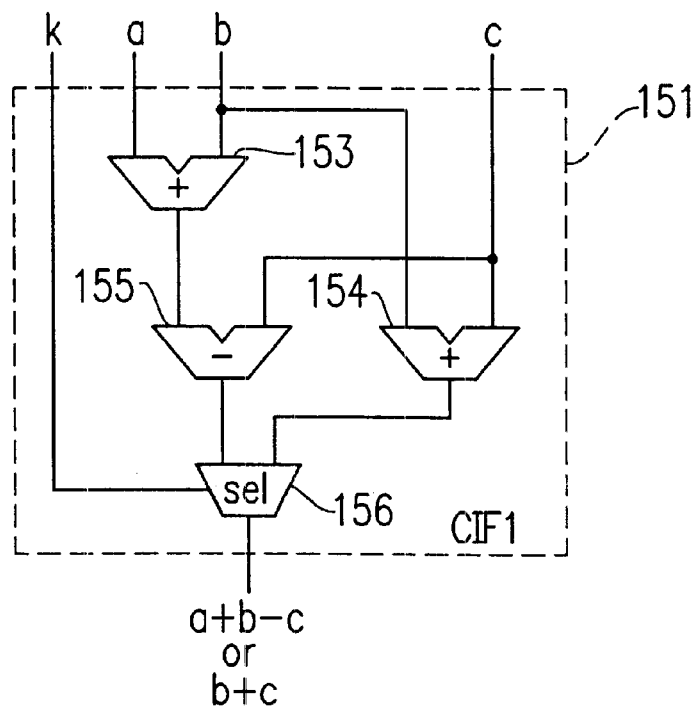
FIG. 34A is a diagram showing a circuit corresponding to a CIF node shown in FIG. 33.
Figure 34B:
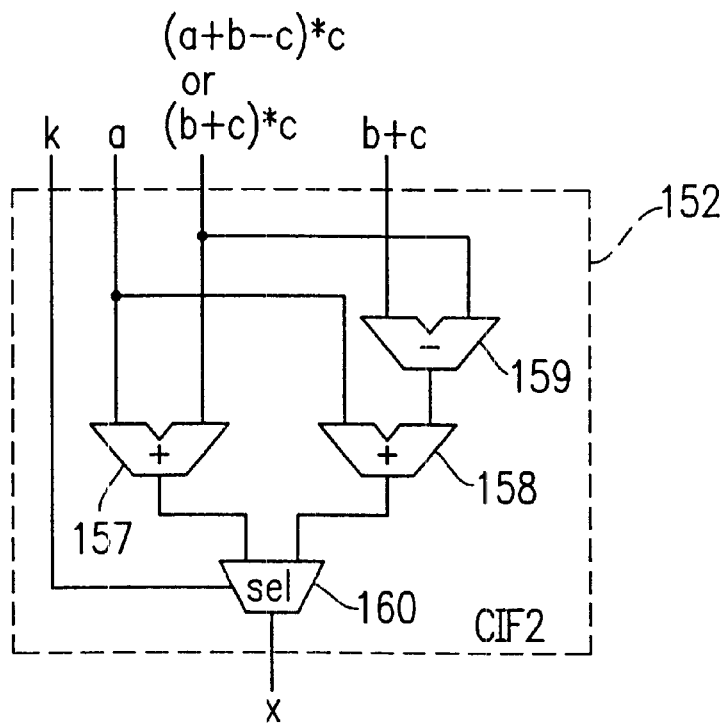
FIG. 34B is a diagram showing a circuit corresponding to a CIF node shown in FIG. 33.

After the separate first and second IF nodes 141 and 142 have been obtained in this way, each of the first and second IF nodes 141 and 142 is subjected to logical synthesis to generate a first CIF node 151 ("CIF1" in FIG. 34A) corresponding to the first IF node 141 and a second CIF node 152 ("CIF2" in FIG. 34B) corresponding to the second IF node 142.

In this case, the first CIF node 151 includes first and second adders 153 and 154, respectively, a first subtracter 155, and a first selector 156. The first adder 153 receives inputs "a" and "b". The second adder 154 receives inputs "b" and "c". The first subtracter 155 receives an output of the first adder 153 and input "c". The selector 156 receives an output of the first subtracter 155 and an output of the second adder 154. In accordance with a control signal k, either the output of the first subtracter 155 or the output of the second adder 154 is output. Therefore, the selector 153 outputs either a result of "a+b−c" or "b+c".

The second CIF node 152 includes third and fourth adders 157 and 158, respectively, a second subtracter 159, and a second selector 160. The third adder 157 receives input "a" and an output from a multiplier 143, i.e., either "(a+b−c)*c" or "(b+c)*c". The second subtracter 159 receives an output from the multiplier 143, i.e., either "(a+b−c)*c" or "(b+c)*c", and an output "b+c" of the first CIF node 151. The fourth adder 158 receives input "a" and an output of the second subtracter 159. The second selector 160 receives an output of the third adder 157 and an output of the fourth adder 158, and outputs either the output of the third adder 157 or the output of the fourth adder 158 as "x".

It is assumed that in each of the CIF nodes 151 and 152 the operating time of each of the adder and the subtracter is 5 nsec, and the operating time of the multiplier is 60 nsec. In this case, the operating time of the first CIF node 151 is 10 nsec, and the operating time of the second CIF node 152 is 10 nsec.

Figure 35:
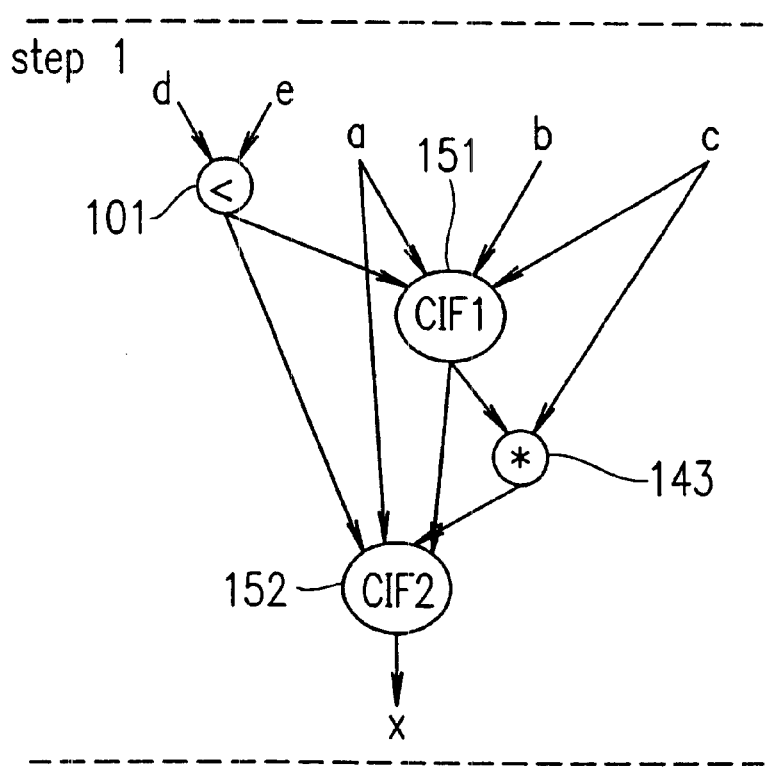
FIG. 35 is a diagram showing an example of a CDFG where the IF nodes of the CDFG of FIG. 34A or 34B are replaced with CIF nodes.

FIG. 35 shows a CDFG using the first and second CIF nodes 151 and 152. A path having the largest operating time in the CDFG is a path passing through the comparison node 101, the first CIF node 151, the multiplication node 143, and the second CIF node 152. Assuming that a clock period is 100 nsec and the operating time of a comparator is 5 nsec, the largest operating time is 85 nsec which does not exceed the clock period. The CDFG of FIG. 35 can be executed for one clock period.

The CDFG of FIG. 27 includes ten nodes where IF nodes are also counted. In contrast, the CDFG of FIG. 35 includes only four nodes, thereby making it possible to perform high-level synthesis at high speed.

Figure 36:
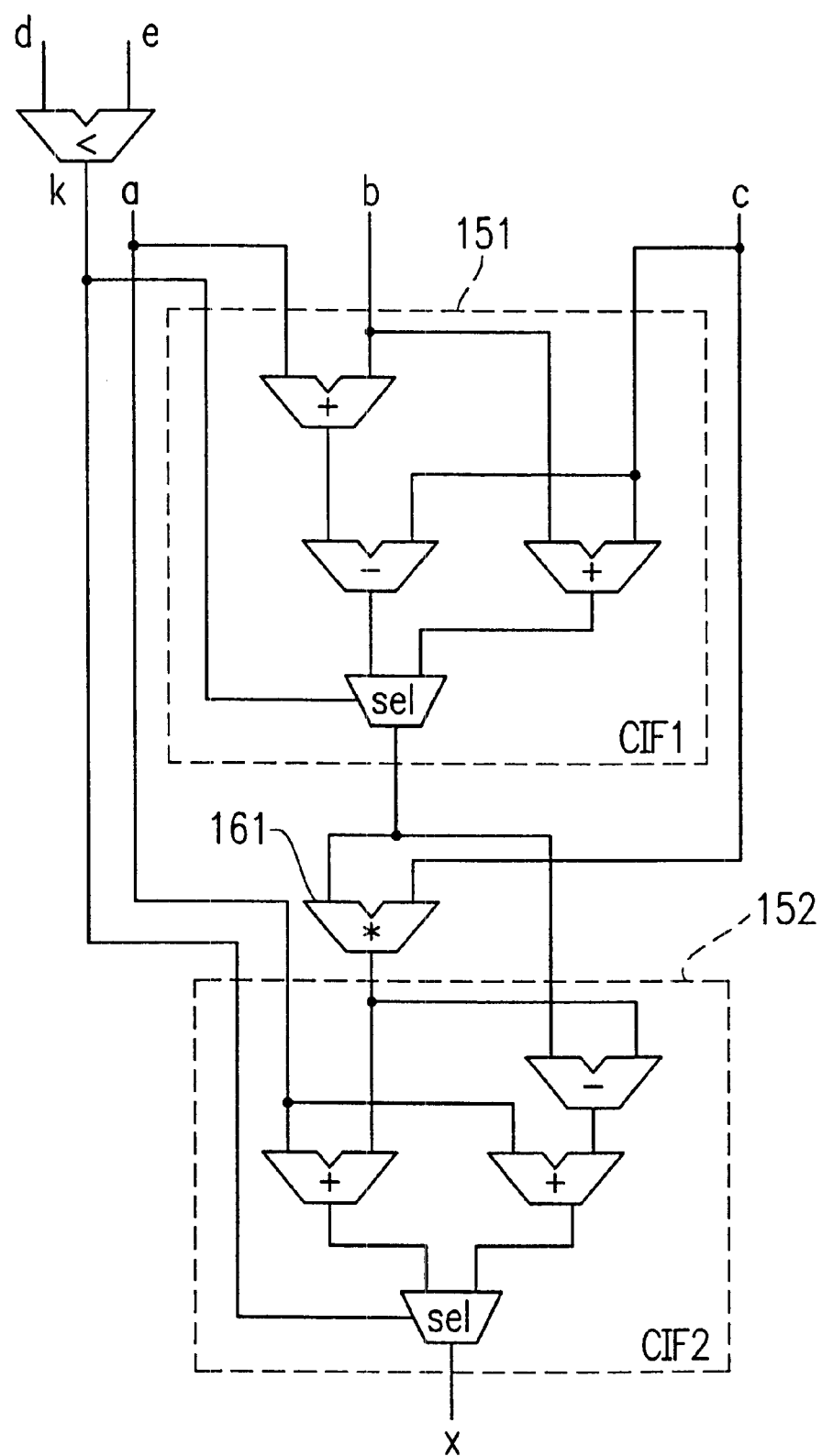
FIG. 36 is a diagram showing a circuit corresponding to the CDFG of FIG. 27.

Although execution of the CDFG of FIG. 27 requires two clock periods, the CDFG of FIG. 35 can be executed for one clock period, resulting in high-speed processing. A circuit shown in FIG. 36 is eventually obtained from the CDFG of FIG. 35. The circuit of FIG. 28 includes two multipliers 122. In contrast, the circuit of FIG. 36 generated from the CDFG of FIG. 27 includes the only multiplier 161, resulting in the small area of the circuit.

Example 5

Figures 37, 38:
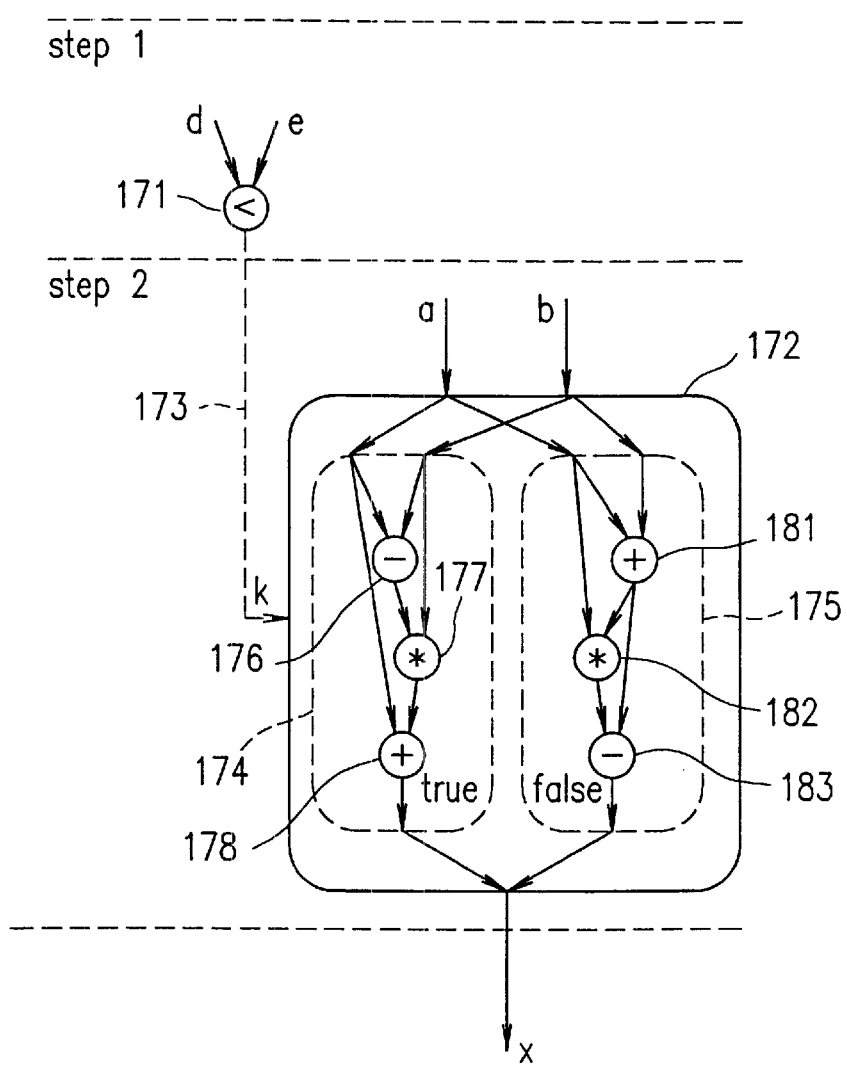
FIG. 37 is a diagram showing another example of an operating description.
FIG. 38 is a diagram showing an example of a CDFG corresponding to the operating description of FIG. 37.

A high-level synthesis method according to Example 5 of the present invention will be described below. In Example 5, the operating description of FIG. 37 is high-level synthesized in a manner similar to that of Examples 1 and 2. In FIG. 37, when an if-condition "d>e" is true, x=(a−b)*b+a, and otherwise (an else-condition) x=(a+b)*a−(a+b).

FIG. 38 shows an example where the operating description is converted to a CDFG and the CDFG is subjected to scheduling. As shown in FIG. 38, a comparison node 171 representing a comparison operation is scheduled in clock step 1, and an IF node 172 is scheduled in clock step 2. The comparison node 171 receives I/O branches from inputs "d" and "e" and a control I/O branch 173 which transfers a control signal k to the IF node 172.

The IF node 172 includes first and second sub-CDFGs 174 and 175. The first sub-CDFG 174 is executed when the control signal k is "1" (true). The second sub-CDFG 175 is executed when the control signal k is "0" (false).

The sub-CDFG 174 indicated by "true" includes a first subtraction node 176 which receives I/O branches from inputs "a" and "b". The I/O branch of the first subtraction node 176 is connected to a first multiplication node 177. The multiplication node 177 receives an I/O branch from input "b". The I/O branch of the first multiplication node 177 is connected to a first addition node 178. The first addition node 178 receives an I/O branch from input "a". The I/O branch of the first addition node 178 is coupled to an I/O branch of the IF node 172.

The sub-CDFG 175 indicated by "false" includes a second addition node 181 which receives I/O branches from inputs "a" and "b". An I/O branch from the second addition node 181 is connected to the second multiplication node 182 and a second subtraction node 183. The second multiplication node 182 receives an I/O branch from input "a". An I/O branch from the second multiplication node 182 is connected to the second subtraction node 183. An I/O branch from the second subtraction node 183 is coupled to the I/O branch of the IF node 172.

Figure 39:
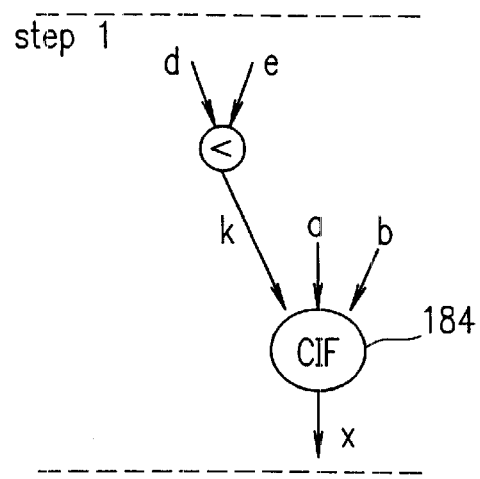
FIG. 39 is a diagram showing an example of a CDFG where the IF nodes of the CDFG of FIG. 38 are replaced with CIF nodes.
Figure 40:
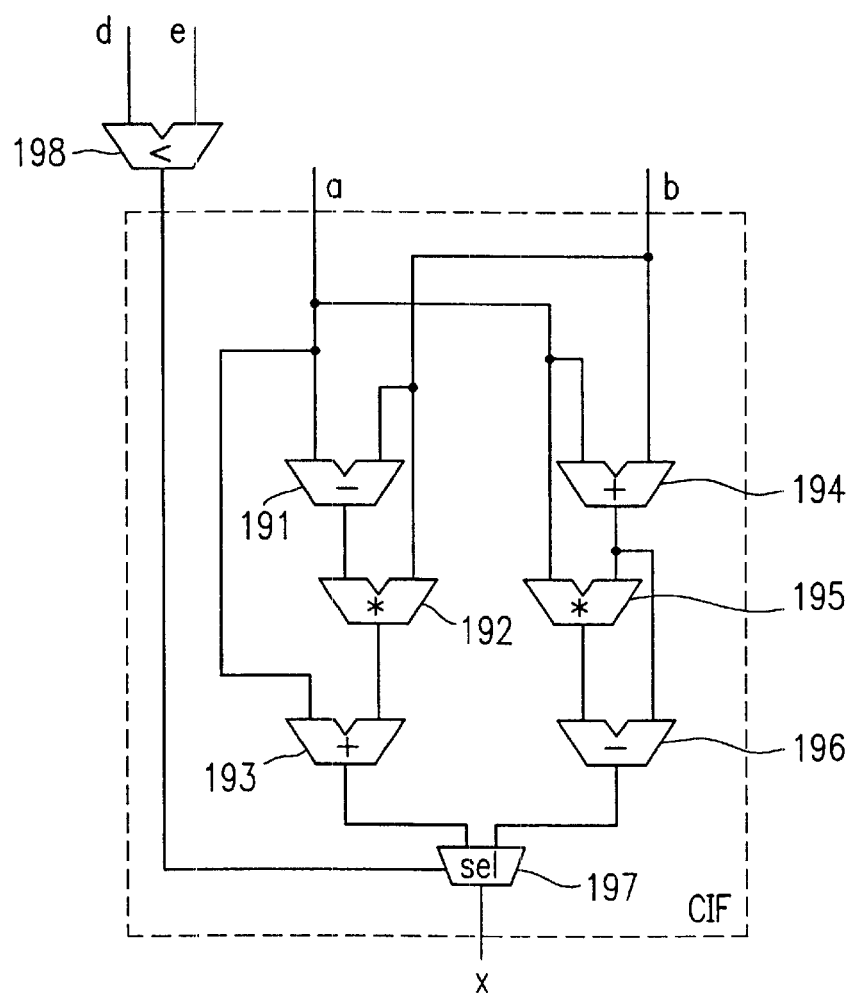
FIG. 40 is a diagram showing a circuit corresponding to the CDFG of FIG. 39.

The IF node 172 of the thus obtained CDFG is converted to a CIF node 184 as shown in FIG. 39 by logical synthesis as described above. A circuit shown in FIG. 40 is obtained based on such a CDFG. The circuit of FIG. 40 includes a first subtracter 191 which receives inputs "a" and "b". An output of the first subtracter 191 is input to the first multiplier 192. The first multiplier 192 also receives input "b", and the output of the first multiplier 192 is input to the first adder 193. The first adder 193 also receives input "a". An output of the first adder 193 is input to the selector 197.

The circuit of FIG. 40 further includes a second adder 194 which receives inputs "a" and "b". An output of the second adder 194 is input to a second multiplier 195. An output of the second multiplier 195 is input to a second subtracter 196. The second subtracter 196 receives an output of the second adder 194. An output of the second subtracter 196 is input to a selector 197. The selector 197 outputs either the output of the first adder 193 or the output of the second subtracter 196, based on the control signal k from the comparator 198.

In such a circuit, when there is an operator satisfying the following expression (2), if a node corresponding to the operator is placed outside the IF node, the area of the circuit can be further reduced.

(the number of inputs to an operator)×(the area of a selector)≦(the area of the operator)　　(2)

Specifically, when there are a plurality of identical operators which correspond to nodes included in a sub-CDFG of an IF node, if the area of one operator is as large as or larger than the number of the inputs of the operator times the area of the selector, the nodes corresponding to the operators are placed outside the IF node.

For example, in the circuit of FIG. 40, each of the multipliers 192 and 195 receives two inputs "true" and "false". Selectors, the number of which is equal to the number (two) of inputs of each of the multipliers 192 and 195 are required. However, such a number of selectors are added to the circuit so that one of the multipliers can be deleted. When the overall area of required selectors is smaller than the area of the deleted multiplier, the area of the whole circuit can be reduced by deleting one multiplier in spite of an increase in the number of selectors.

In the circuit of FIG. 40, it is assumed that an area proportion of a multiplier to an adder or subtracter to a selector is 10:2:2. Among operators corresponding to the respective nodes included in the sub-CDFGs 174 and 175 of the IF node 172 of FIG. 38, operators which satisfy the above-described expression (2) are the multipliers 192 and 195 (FIG. 40).

Therefore, the multiplication nodes 177 and 182 (FIG. 38) corresponding to the multipliers 192 and 195 are placed outside the IF node 172 as described in Example 3.

Figure 41:
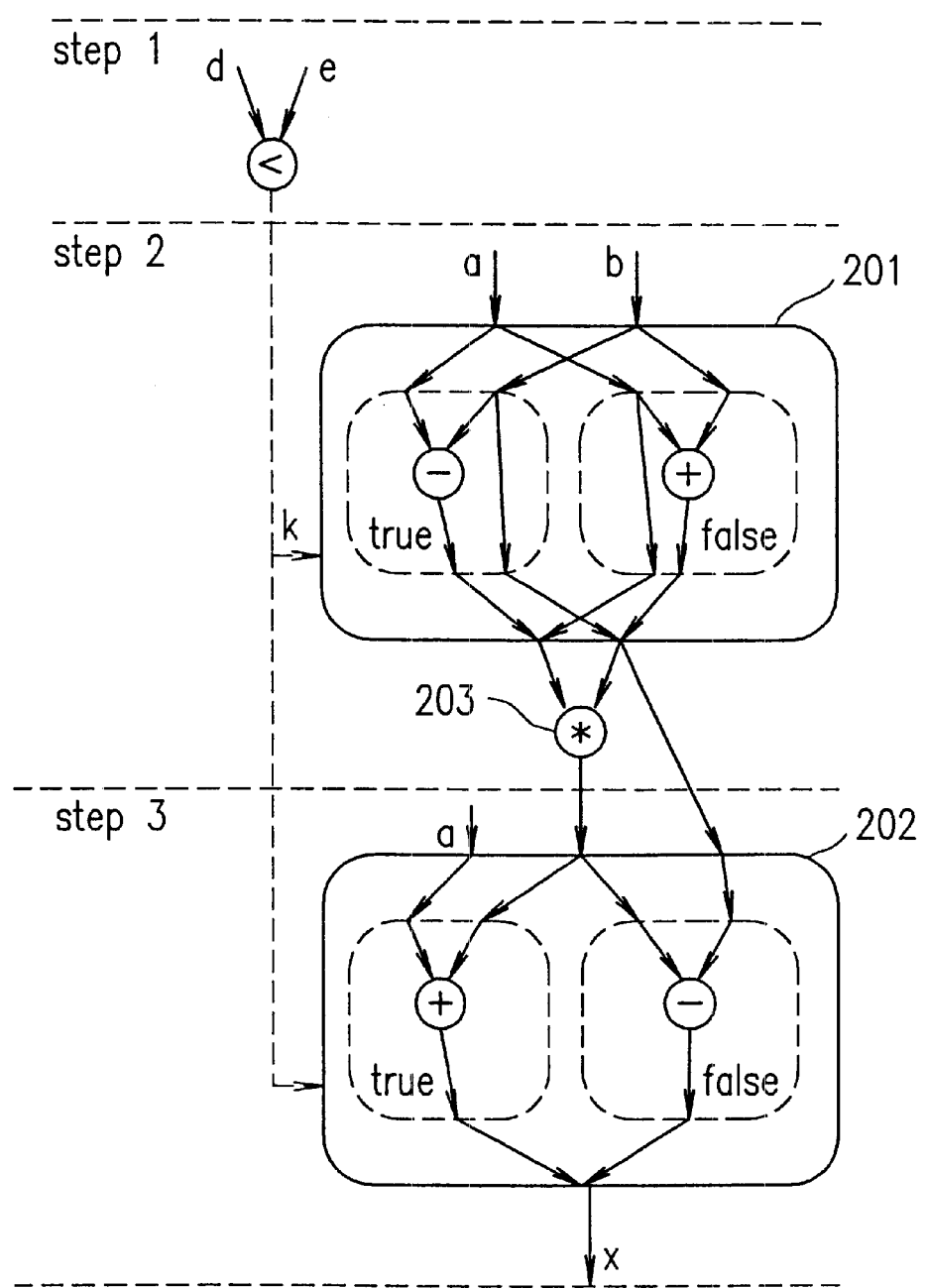
FIG. 41 is a diagram showing an example of a CDFG where the CDFG of FIG. 38 is divided.

FIG. 41 shows a CDFG where the IF node 172 is divided into two groups. In the CDFG, the IF node 172 is divided into a group including nodes positioned at an upper side of the multiplication nodes 177 and 182 and a group including nodes positioned at a lower side of the multiplication nodes 177 and 182, i.e., a first IF node 201 and a second IF node 202. Therefore, the multiplication nodes 177 and 182 are placed outside the first IF node 201 and the second IF node 202. Then, the multiplication nodes 177 and 182 are replaced with a single common multiplier node 203, and unnecessary I/O branches are deleted, resulting in a CDFG shown in FIG. 41.

Thus, when the overall area of required selectors is smaller than the area of the deleted multiplier, the area of the entire circuit can be reduced.

Figure 42:
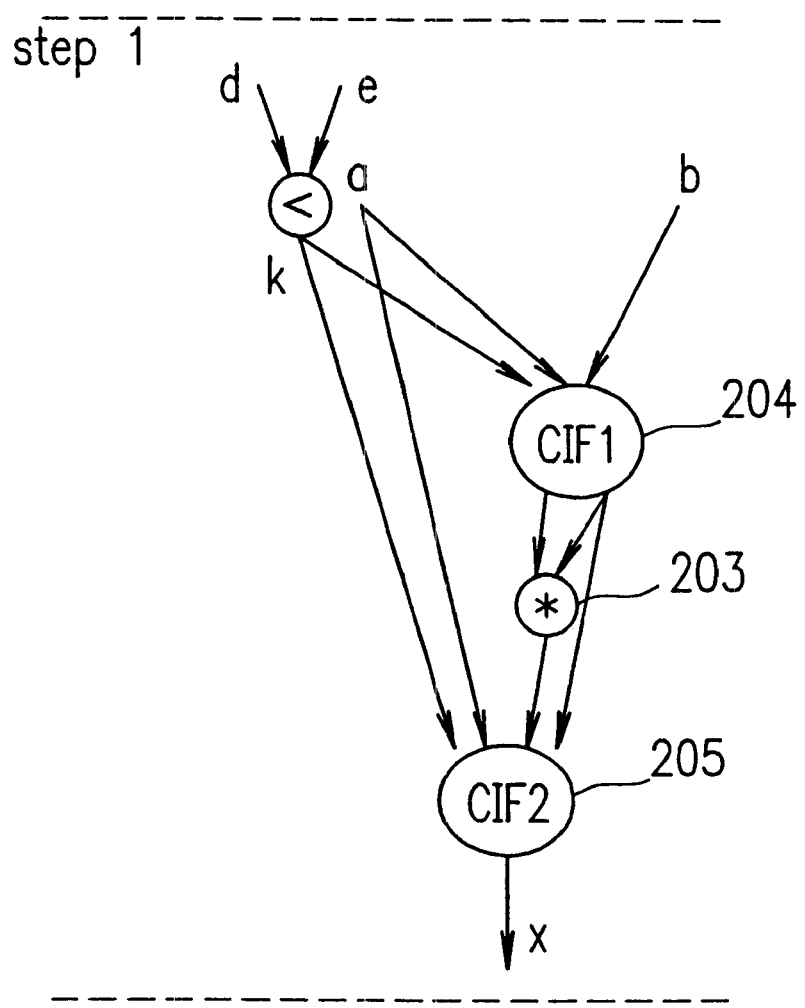
FIG. 42 is a diagram showing an example of a CDFG where the IF nodes of the CDFG of FIG. 41 are replaced with CIF nodes.
Figure 43:
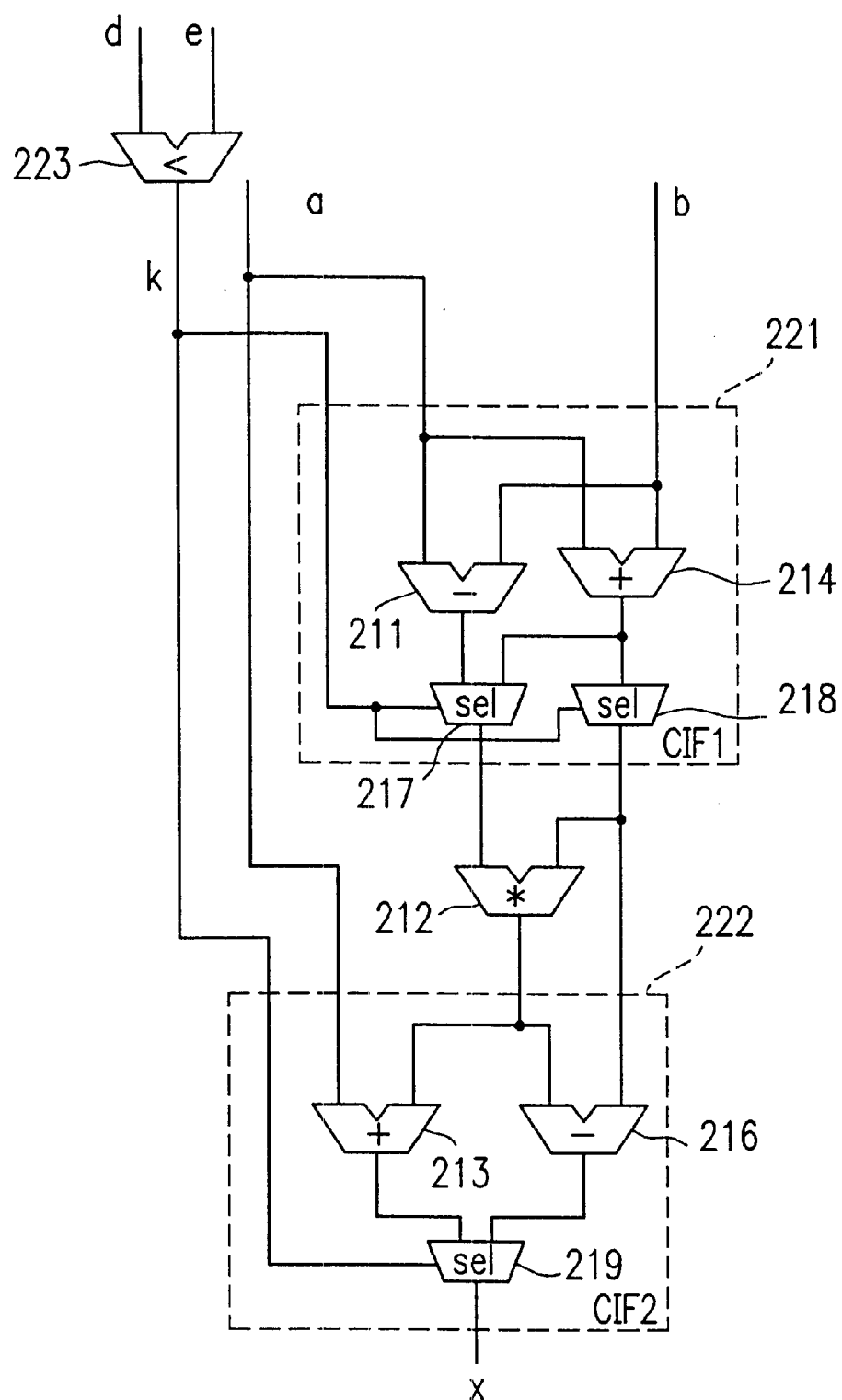
FIG. 43 is a diagram showing a circuit corresponding to the CDFG of FIG. 42.

FIG. 42 shows a scheduling result of a CDFG where the first IF node 201 and the second IF node 202 of the CDFG of FIG. 41 is replaced with first and second CIF nodes 204 and 205 ("CIF1" and "CIF2", respectively), which are combinatorial logic circuits, in the above-described manner. FIG. 43 shows a circuit based on the scheduling result of FIG. 42.

The circuit of FIG. 43 includes a first combinatorial logic circuit 221 corresponding to the first CIF node 204, a second combinatorial logic circuit 222 corresponding to the second CIF node 205, and a multiplier 212 provided between the combinatorial logic circuits 221 and 222. The first combinatorial logic circuit 221 includes a first subtracter 211 and a first adder 214, each of which receives inputs "a" and "b". The outputs of the first subtracter 211 and the first adder 214 are input to a first selector 217. The outputs of the first subtracter 211 and the first adder 214 are also input to a second selector 218.

The first and second selectors 217 and 218 select either the output of the first subtracter 211 or the output of the first adder 214 in accordance with a control signal k from the comparator 223 and outputs the selected output. Each of the outputs of the first selector 217 and the output of the second selector 218 is input to the multiplier 212.

The output of the multiplier 212 is input to a second adder 213 and a second subtracter 216 provided in the second combinatorial logic circuit 222. The outputs of the second adder 213 and the second subtracter 216 are input to a third selector 219. The third selector 219 selects either the output of the second adder 213 or the output of the second subtracter 216 in accordance with the control signal k from the comparator 223 and outputs the selected output. The output of the third selector 219 is the output "x" of the calculation result.

The circuit of FIG. 43 is compared with the circuit of FIG. 40. The circuit of FIG. 40 includes the two multipliers 192 and 195, but includes only one selector 197. In contrast, the circuit of FIG. 43 includes only one multiplier 212, but includes three selectors 217 through 219. In this case, the area of one multiplier is larger than the overall area of the additional selectors, thereby satisfying the above-described expression (2). Therefore, the area of the entire circuit of FIG. 43 is smaller than the area of the entire circuit of FIG. 40.

When there are a plurality of nodes which satisfy expression (2) in the sub-CDFG indicated by "true" or "false", the above-described method is performed so that an operator having the largest area among operators for executing operations corresponding to the nodes is placed outside an IF node which is in turn divided into two IF nodes. The resultant two IF nodes are subjected to the above-described method again.

When a common operator is allocated as a node which is placed outside an IF node (e.g., the multiplication node 203 in FIG. 42) and another node, the area of the circuit of FIG. 40 is further reduced. In this case, even if the area of the operator is not sufficiently large so as to satisfy expression (2), the area is still effectively reduced. Taking such an effect into account, expression (2) may be replaced with the following expression (3):

(the number of inputs to an operator)×(the area of a selector)×(a constant)≦(the area of the operator)     (3)

where the constant is a numerical value less than one, which is experimentally obtained.

According to the high-level synthesis method of the present invention, a plurality of nodes included in a portion of a CDFG are regarded as one node, so that the number of nodes included the CDFG is reduced. Thereby, a processing time required for high-level synthesis can be reduced. Further, a node corresponding to a portion of the CDFG is subjected to logical synthesis and optimized in advance. The operating time of the logically synthesized node is equal to the operating time of the node in a final circuit. Therefore, estimation of an operating time is satisfactorily accurate.

Further, a portion of a CDFG corresponding to conditional branching as well as a control signal k for the conditional branching are subjected to logical synthesis, thereby reducing a processing time required for high-level synthesis and improving accuracy of estimation of operating times. The number of selectors included in a synthesized circuit is decreased, thereby reducing the scale of the circuit. Moreover, generation of a signal for controlling the conditional branching using a controller is not required, thereby reducing the circuit scale. Decision of the condition of conditional branching and operation of a conditional branch can be executed in the same clock step. Therefore, a circuit obtained by high-level synthesis can be operated at high speed.

Further, a useless clock step is not likely to be generated regardless of whether the condition of conditional branching is true or false. Therefore, a circuit obtained by high-level synthesis can be operated at high speed.

Further, the scale of a circuit can be reduced and the circuit can be operated at high speed, even when a CDFG cannot be logically synthesized in advance to generate a combinatorial logic circuit since the CDFG includes an operator involved with transmission and reception of a signal with a controller, or even when the scale of a combinatorial logic circuit obtained by logically synthesizing a CDFG is unnecessarily large since the CDFG includes a large operator.

Further, the scale of a circuit can be reduced and the circuit can be operated at high speed, even when an operating description includes an operator having a large area.

Further, the present invention provides a storage medium storing the above-described high-level synthesis method. With such a storage medium, the high-level synthesis method can be easily performed.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A high-level synthesis method comprising the steps of:

converting an operating description describing one or more operations to a control data flow graph (CDFG) including one or more nodes representing the one or more operations and one or more I/O branches representing a flow of data;

scheduling the CDFG obtained by the converting step; and allocating one or more logic circuits required for executing the CDFG obtained by the scheduling step, wherein a portion of the CDFG in the converting step is subjected to logical synthesis in advance to generate a node, and the portion of the CDFG is replaced with that node.

2. A high-level synthesis method according to claim 1, wherein the portion of the CDFG corresponds to conditional branching.

3. A high-level synthesis method according to claim 2, wherein the conditional branching includes a branch to be executed when a condition of the conditional branching is satisfied, and a branch to be executed when the condition of the conditional branching is not satisfied, and the branches are processed in a same clock period.

4. A high-level synthesis method according to claim 2, wherein a specific node originally included in the portion of the CDFG is placed outside the portion of the CDFG.

5. A high-level synthesis method according to claim 2, wherein a specific node originally included in the portion of the CDFG is placed outside the portion of the CDFG by dividing the portion of the CDFG.

6. A high-level synthesis method according to claim 4, wherein when a plurality of identical operators are allocated in the portion of the CDFG in the allocating step and when an area of one of the plurality of identical operators is as large as or larger than a constant times an area of a selector, nodes corresponding to the plurality of identical operators are placed outside the portion of the CDFG.

7. A high-level synthesis method according to claim 5, wherein when a plurality of identical operators are allocated in the portion of the CDFG in the allocating step and when an area of one of the plurality of identical operators is as large as or larger than a constant times an area of a selector, nodes corresponding to the plurality of identical operators are placed outside the portion of the CDFG.

8. A storage medium storing a program including a high-level synthesis method comprising the steps of:

converting an operating description describing one or more operations to a control data flow graph (CDFG) including one or more nodes representing the one or more operations and one or more I/O branches representing a flow of data;

scheduling the CDFG obtained by the converting step; and allocating one or more logic circuits required for executing the CDFG obtained by the scheduling step, wherein a portion of the CDFG in the converting step is subjected to logical synthesis in advance to generate a node, and the portion of the CDFG is replaced with that node.

* * * * *